United States Patent
Nam et al.

(10) Patent No.: US 9,871,055 B1
(45) Date of Patent: Jan. 16, 2018

(54) VERTICAL-TYPE MEMORY DEVICE

(71) Applicants: Phil-ouk Nam, Osan-si (KR); Sung-gil Kim, Yongin-si (KR); Ji-hoon Choi, Seongnam-si (KR); Seul-ye Kim, Seoul (KR); Jae-young Ahn, Seongnam-si (KR); Hong-suk Kim, Yongin-si (KR)

(72) Inventors: Phil-ouk Nam, Osan-si (KR); Sung-gil Kim, Yongin-si (KR); Ji-hoon Choi, Seongnam-si (KR); Seul-ye Kim, Seoul (KR); Jae-young Ahn, Seongnam-si (KR); Hong-suk Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/462,933

(22) Filed: Mar. 20, 2017

(30) Foreign Application Priority Data

Aug. 5, 2016 (KR) .......................... 10-2016-0100125

(51) Int. Cl.
| | |
|---|---|
| *H01L 27/115* | (2017.01) |
| *H01L 27/11582* | (2017.01) |
| *H01L 27/11556* | (2017.01) |
| *H01L 29/78* | (2006.01) |
| *H01L 27/1157* | (2017.01) |

(52) U.S. Cl.
CPC .. *H01L 27/11582* (2013.01); *H01L 27/11556* (2013.01); *H01L 29/7827* (2013.01); *H01L 27/1157* (2013.01)

(58) Field of Classification Search
CPC ................................................. H01L 27/1157
USPC ......................................................... 257/330
See application file for complete search history.

(56) References Cited

U.S. PATENT DOCUMENTS

| | | | |
|---|---|---|---|
| 7,170,126 B2 | 1/2007 | Cheng et al. | |
| 8,748,249 B2 | 6/2014 | Yang et al. | |
| 8,877,591 B2 | 11/2014 | Choe et al. | |
| 8,987,803 B2 * | 3/2015 | Chae | H01L 27/1157 257/200 |
| 9,356,044 B2 | 5/2016 | Seol et al. | |
| 2010/0090286 A1 * | 4/2010 | Lee | H01L 27/11526 257/368 |
| 2011/0298037 A1 * | 12/2011 | Choe | G11C 16/0483 257/324 |
| 2011/0303970 A1 * | 12/2011 | Kim | H01L 27/11578 257/324 |
| 2012/0037977 A1 * | 2/2012 | Lee | H01L 27/11578 257/324 |

(Continued)

*Primary Examiner* — George Fourson, III
(74) *Attorney, Agent, or Firm* — Myers Bigel, P.A.

(57) ABSTRACT

A vertical-type memory device may include a channel layer vertically extending on a substrate, a ground selection transistor at a side of the channel layer on the substrate, the ground selection transistor including a first gate insulation portion and a first replacement gate electrode, an etch control layer on the first replacement gate electrode, and a memory cell on the etch control layer, the memory cell including a second gate insulation portion and a second replacement gate electrode. The etch control layer may include a polysilicon layer doped with carbon, N-type impurities, or P-type impurities, or may include a polysilicon oxide layer comprising carbon, N-type impurities, or P-type impurities. A thickness of the first replacement gate electrode may be the same as a thickness of the second replacement gate electrode, or the first replacement gate electrode may be thicker than the second.

20 Claims, 26 Drawing Sheets

(56) References Cited

U.S. PATENT DOCUMENTS

| | | |
|---|---|---|
| 2015/0137210 A1 | 5/2015 | Nam et al. |
| 2015/0357342 A1 | 12/2015 | Lee |
| 2016/0225785 A1* | 8/2016 | Kim .................. H01L 27/11575 |
| 2017/0084624 A1* | 3/2017 | Lee .................. H01L 27/11582 |
| 2017/0084626 A1* | 3/2017 | Kim .................. H01L 27/11582 |
| 2017/0084696 A1* | 3/2017 | Lee .................. H01L 27/11565 |
| 2017/0194347 A1* | 7/2017 | Lee .................... H01L 27/11582 |

* cited by examiner

US 9,871,055 B1

VERTICAL-TYPE MEMORY DEVICE

CROSS-REFERENCE TO RELATED APPLICATION

This application claims the benefit of Korean Patent Application No. 10-2016-0100125, filed on Aug. 5, 2016, in the Korean Intellectual Property Office, the disclosure of which is incorporated herein in its entirety by reference.

BACKGROUND

1. Technical Field

The present disclosure relates to a memory device, and more particularly, to a vertical-type memory device.

2. Description of Related Art

Electronic products have gradually decreased in size, but are still expected to perform high-capacity data processing. Accordingly, it may be desirable to increase the degree of integration of memory devices that are used in such electronic products. One possible method of improving the degree of integration of memory devices, where vertical-type memory devices having a vertical transistor structure instead of a planar transistor structure are used, has been proposed.

SUMMARY

The present disclosure may provide a vertical-type memory device that may be more reliable and may be easier to manufacture.

According to an aspect of the present disclosure, there is provided a vertical-type memory device including a channel layer vertically extending on a substrate, a ground selection transistor at a side of the channel layer on the substrate, the ground selection transistor including a first gate insulation portion and a first replacement gate electrode, an etch control layer on the first replacement gate electrode, and a memory cell on the etch control layer, the memory cell including a second gate insulation portion and a second replacement gate electrode.

According to another aspect of the present disclosure, there is provided a vertical-type memory device including a channel layer vertically extending on a substrate, a gate insulation layer at a side of the channel layer, the gate insulation layer vertically extending on the substrate, an etch control layer at a side of the gate insulation layer, the etch control layer extending horizontally with respect to the substrate and separated vertically with respect to the substrate by a first opening, a first replacement gate electrode in the first opening under the etch control layer, a plurality of interlayer insulation layers stacked on the etch control layer vertically with respect to the substrate, and separate from each other due to a plurality of second openings, and a second replacement gate electrode in each of the plurality of second openings.

According to another aspect of the present disclosure, there is provided a vertical-type memory device. The vertical-type memory device may include a channel layer vertically extending on a substrate and a pad insulation material layer on the substrate. An etch control layer may be above the pad insulation material layer. The vertical-type memory device may include a gate insulation layer at a side of the channel layer, which may vertically extend on a wall of the etch control layer and horizontally extend into a recess between the etch control layer and the pad insulation material layer. The vertical-type memory device may include a first replacement gate electrode on a wall of the gate insulation layer between the etch control layer and the pad insulation material layer.

BRIEF DESCRIPTION OF THE DRAWINGS

Aspects of the present disclosure will be more clearly understood from the following detailed description taken in conjunction with the accompanying drawings in which.

DETAILED DESCRIPTION

Hereinafter, exemplary embodiments of the present disclosure will be described in detail with reference to the accompanying drawings. The singular forms "a," "an," and "the" used herein are intended to include the plural forms as well, unless the context clearly indicates otherwise.

Figure 1:
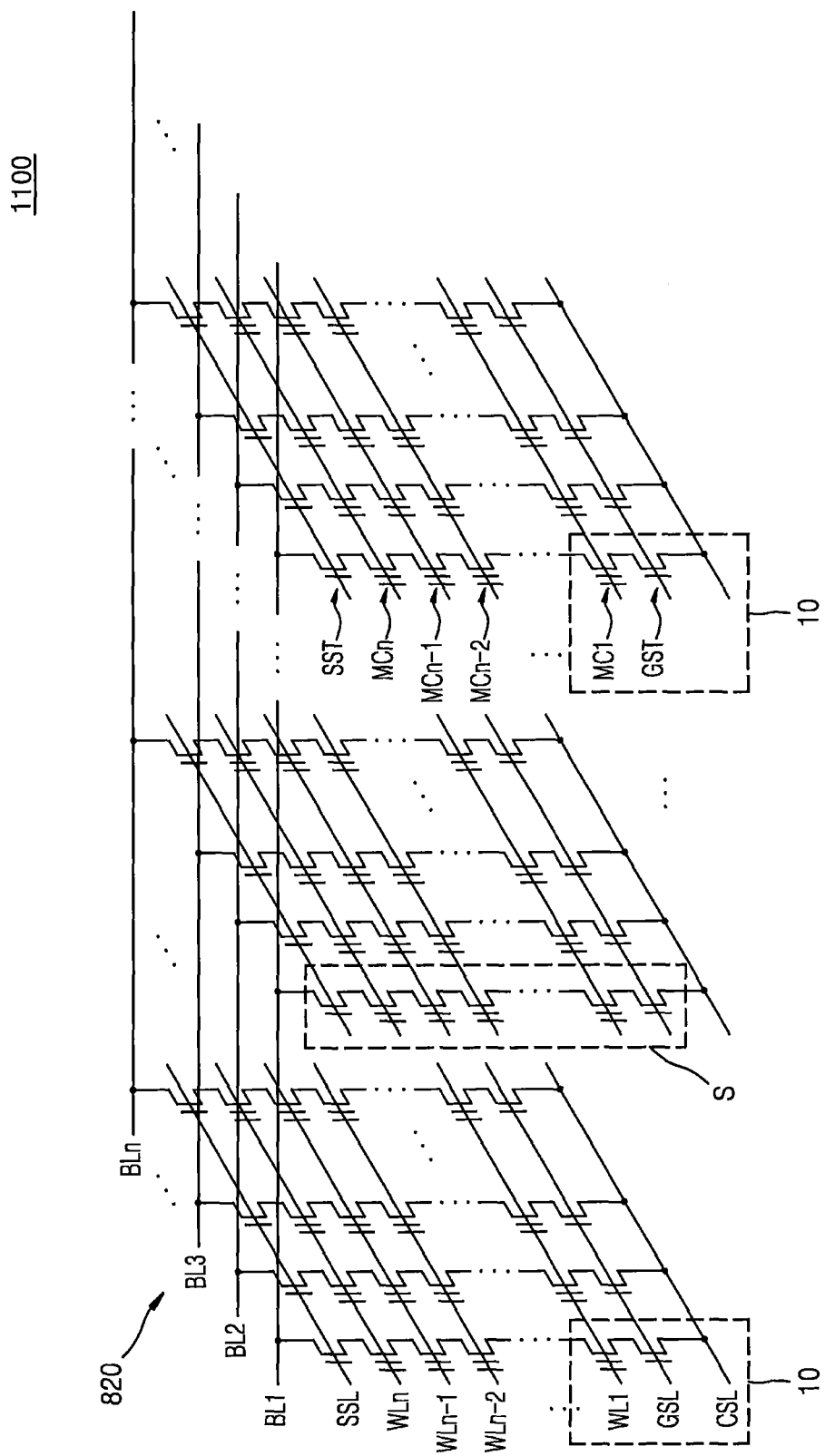
FIG. 1 is a circuit diagram for describing a vertical-type memory device according to aspects of the present disclosure.

FIG. 1 is a circuit diagram for describing a vertical-type memory device 1100 according to aspects of the present disclosure.

In detail, FIG. 1 illustrates a memory cell array 820 of the vertical-type memory device 1100. The vertical-type memory device 1100 may include unit cell strings S each including n memory cells MC1 to MCn connected to each other in series, a ground selection transistor GST connected to one of the two ends of the memory cells MC1 to MCn in series, and a string selection transistor SST connected to the other end of the memory cells MC1 to MCn. The unit cell strings S are connected in parallel between n bit lines BL1 to BLn and a ground selection line GSL.

The n memory cells MC1 to MCn connected to each other in series may be respectively connected to word lines WL1 to WLn for selecting at least some of the memory cells MC1 to MCn. A gate terminal (gate electrode) of the ground selection transistor GST may be connected to the ground selection line GSL, and a source terminal of the ground selection transistor GST may be connected to a common source line CSL.

A gate terminal (gate electrode) of the string selection transistor SST may be connected to a string selection line SSL, and a source terminal of the string selection transistor SST may be connected to a drain terminal of a memory cell MCn. Although FIG. 1 illustrates a structure where one ground selection transistor GST and one string selection transistor SST are connected to the n memory cells MC1 to MCn connected to each other in series, if necessary, a plurality of ground selection transistors GST or a plurality of string selection transistors SST may be connected thereto.

A drain terminal of the string selection transistor SST may be connected to the bit lines BL1 to BLn. When a signal is applied to the gate terminal of the string selection transistor SST via the string selection line SSL, the signal that is applied via the bit lines BL1 to BLn may be transmitted to the n memory cells MC1 to MCn connected to each other in series, and thus, an operation of reading or writing data may be performed.

In addition, the source terminal of the string selection transistor SST may apply a signal to the gate terminal of the ground selection transistor GST connected to the common source line CSL via the ground selection line GSL, thereby performing an erase operation in which charges stored in the n memory cells MC1 to MCn are all removed.

Figure 2A:
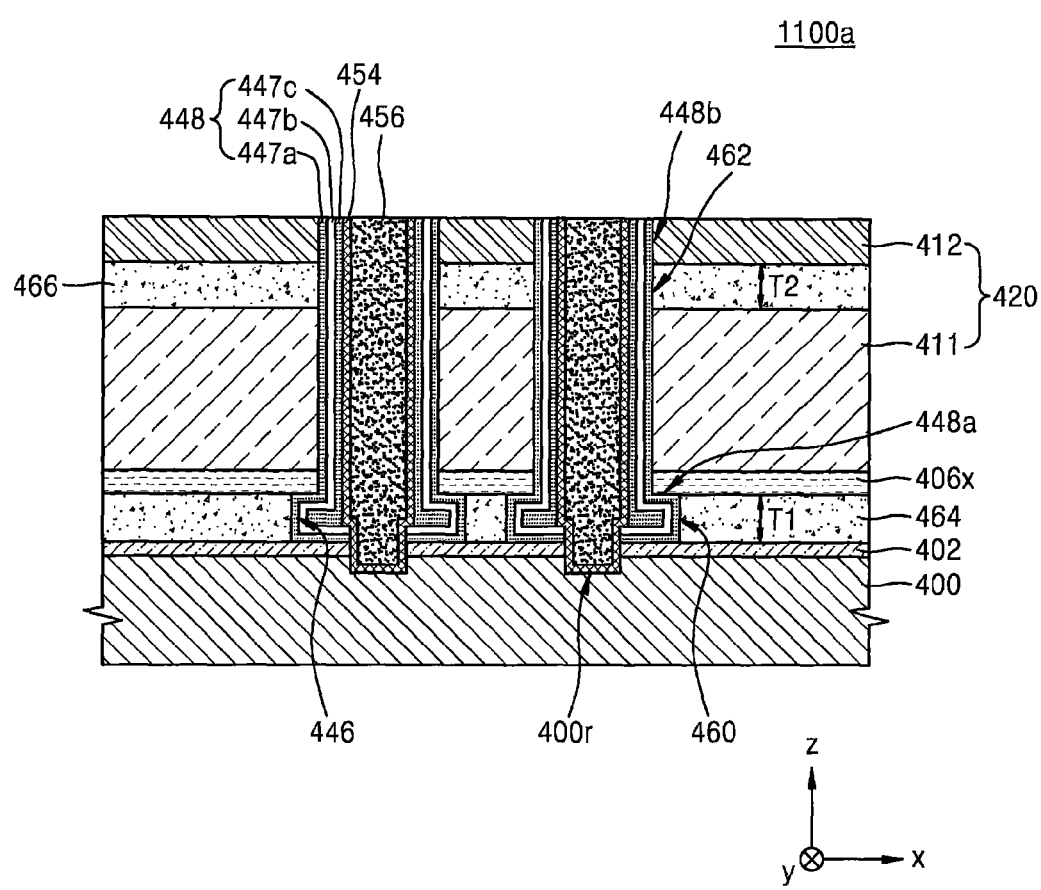
FIGS. 2A and 2B are cross-sectional views of main portions of vertical-type memory devices according to aspects of the present disclosure.
Figure 2B:
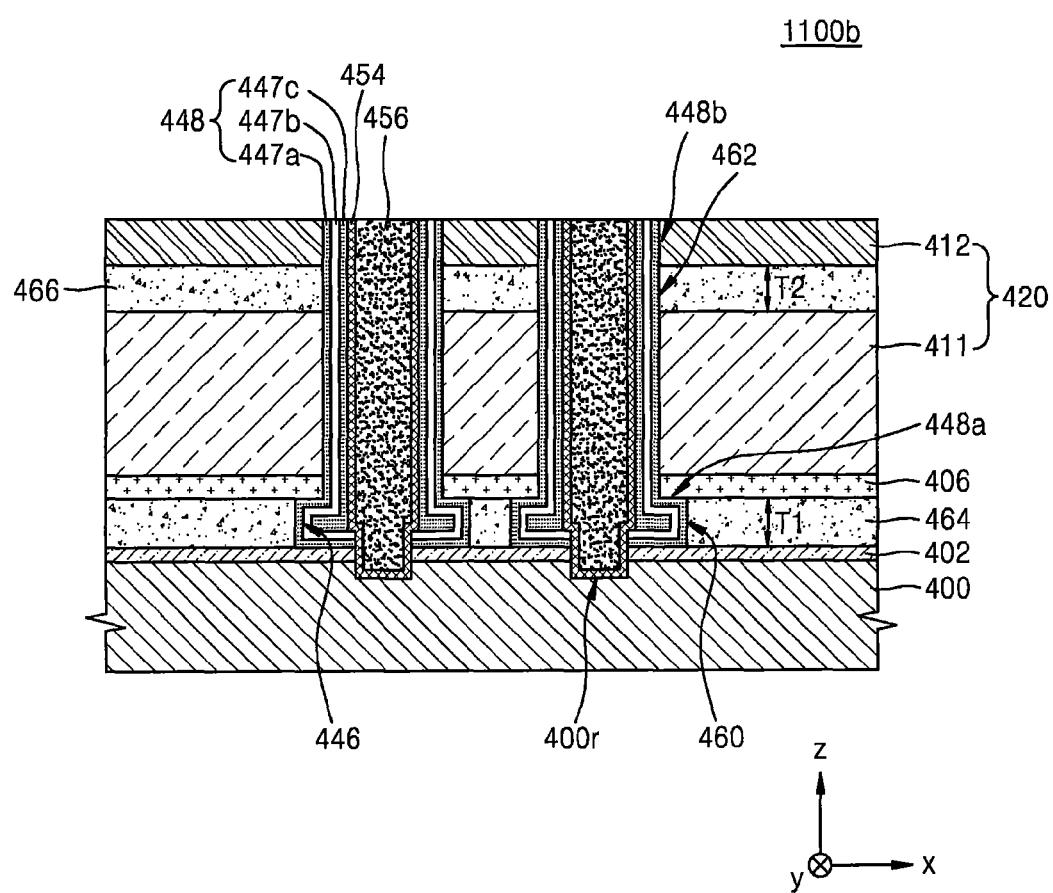

FIGS. 2A and 2B are cross-sectional views of main portions of vertical-type memory devices 1100a and 1100b according to aspects of the present disclosure.

In detail, the vertical-type memory devices 1100a and 1100b of FIGS. 2A and 2B are illustrated for explaining reference numeral 10 of FIG. 1. Particularly, FIGS. 2A and 2B may be diagrams for describing the ground selection transistor GST and a memory cell MC1 of FIG. 1. FIGS. 2A and 2B may be the same as, or similar to, each other except for composition materials of etch control layers 406x and 406.

Each of the vertical-type memory devices 1100a and 1100b of FIGS. 2A and 2B may include a channel layer 454, which may extend vertically (e.g., in direction z) on a substrate 400. The substrate 400 may extend orthogonally to the channel layer 454 (e.g., in direction x or in direction y). As illustrated in FIGS. 2A and 2B, the channel layer 454 may be a pillar-type channel layer filled with a filling insulation layer 456. The channel layer 454 may be a hollow cylinder-type channel layer. A recess 400r may be in the substrate 400. The channel layer 454 may be in the recess 400r and may contact the substrate 400.

A gate insulation layer 448 may be disposed vertically on the substrate 400 and at a side of the channel layer 454. The gate insulation layer 448 may include a blocking insulation layer 447a, a charge storage layer 447b, and a tunnel insulation layer 447c. A ground selection transistor (e.g., the GST illustrated in FIG. 1) including a first gate insulation portion 448a and a first replacement gate electrode 464 may be at a side of the channel layer 454. The first replacement gate electrode 464 may have a recess facing the channel layer 454.

An etch control layer (406x in FIG. 2A, 406 in FIG. 2B) may be provided. Each of the etch control layers 406x and 406 may be on the first replacement gate electrode 464. At a side of the first gate insulation portion 448a, each of the etch control layers 406x and 406 may extend horizontally (e.g., parallel) with respect to the substrate 400 (e.g., in direction x or in direction y). Each of the etch control layers 406x and 406 may be separated vertically with respect to the substrate 400 by a first opening 460, which may be referred to herein in some embodiments as a first rib groove 460. The first replacement gate electrode 464 may fill in the first rib groove 460 under each of the etch control layers 406x and 406. The first replacement gate electrode 464 may include a metal layer, for example, tungsten (W).

The etch control layer 406x of FIG. 2A may be a polysilicon oxide layer including N-type impurities or P-type impurities. The etch control layer 406 of FIG. 2B may be a polysilicon layer doped with carbon, N-type impurities, or P-type impurities. A recess side groove 446 may be under each of the etch control layers 406x and 406. The first gate insulation portion 448a may be in the recess side groove 446.

A memory cell (MC1 of FIG. 1), which may be separated by interlayer insulation layers 420 and may include a second gate insulation portion 448b and a second replacement gate electrode 466, may be on each of the etch control layers 406x and 406.

On each of the etch control layers 406x and 406, the interlayer insulation layers 420 may be stacked vertically with respect to the substrate 400. The interlayer insulation layers 420 may be separate from each other due to a second opening 462, which may be referred to herein in some embodiments as a second rib groove 462. Each of FIGS. 2A and 2B shows only one memory cell, and accordingly, shows only two interlayer insulation layers 420 and only one second rib groove 462. The second replacement gate electrode 466 may fill in the second rib groove 462. The second replacement gate electrode 466 may include a metal layer, for example, tungsten (W). A thickness T2 of the second replacement gate electrode 466 may be the same as a thickness T1 of the first replacement gate electrode 464. The thicknesses T1 and T2 of the first replacement gate electrode 464 and the second replacement gate electrode 466 may correspond to a channel length.

As will be described later, the vertical-type memory devices 1100a and 1100b having the above-described structure may respectively include the etch control layers 406x and 406 and thus may allow the channel layer 454 to easily contact the substrate 400. Accordingly, in the vertical-type memory devices 1100a and 1100b, a silicon epi-layer under the channel layer 454 may be omitted.

As will be described later, the vertical-type memory devices 1100a and 1100b according to the present disclosure may have a thickness of the first replacement gate electrode 464 (a channel length) adjusted during manufacturing processes and thus may have thicknesses of the first replacement gate electrode 464 and the second replacement gate electrode 466 that are the same as each other.

As a result, as will be described later, the first replacement gate electrode 464 and the second replacement gate electrode 466 of the vertical-type memory devices 1100a and 1100b according to the present disclosure may be formed simultaneously, and thus, manufacturing processes may be simplified, and device manufacturing costs may be decreased.

Figure 3A:
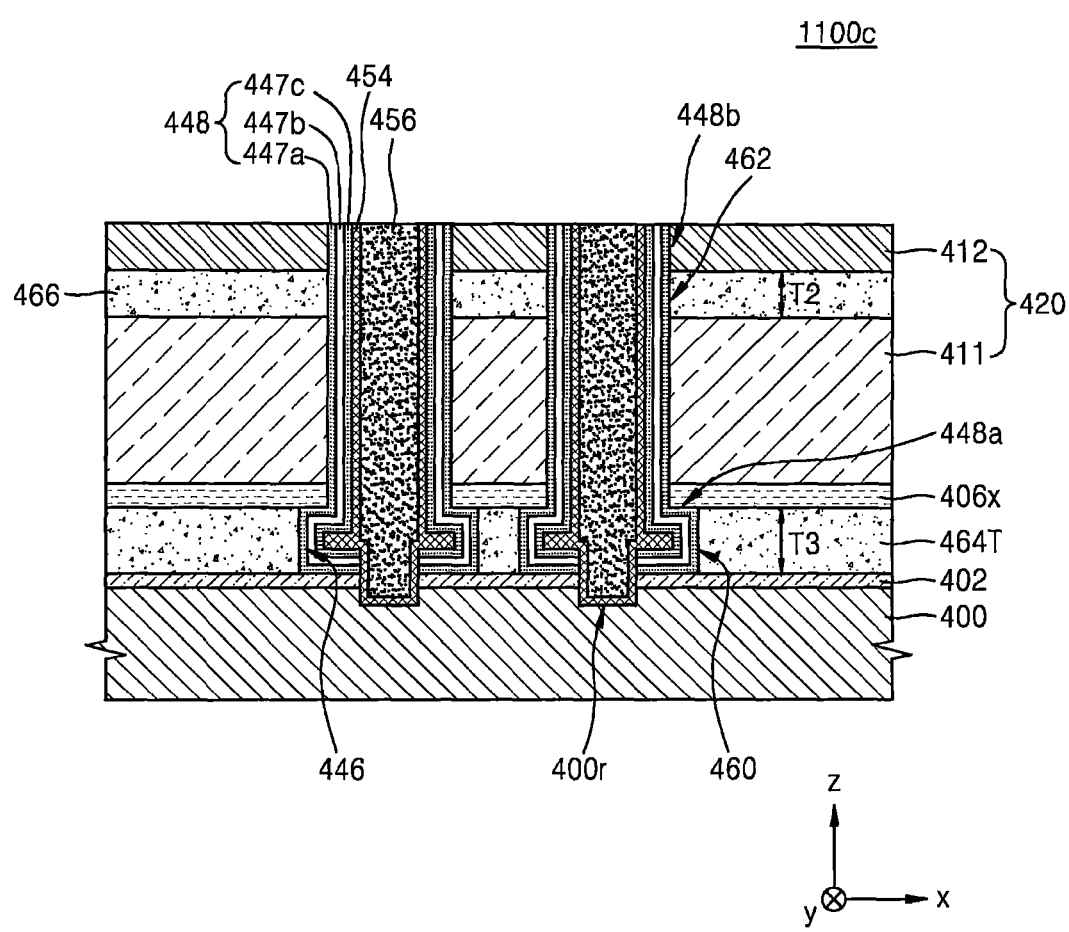
FIGS. 3A and 3B are cross-sectional views of main portions of vertical-type memory devices according to aspects of the present disclosure.
Figure 3B:
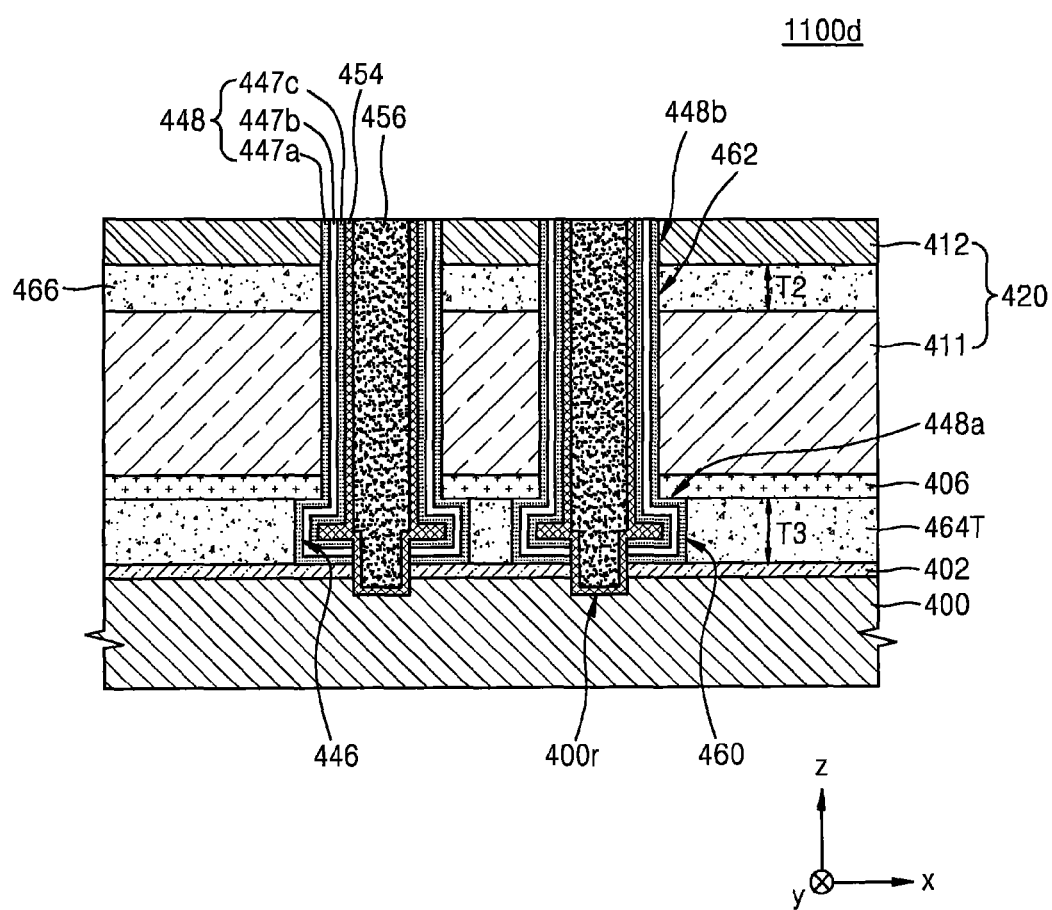

FIGS. 3A and 3B are cross-sectional views of main portions of vertical-type memory devices 1100c and 1100d according to aspects of the present disclosure.

In detail, the vertical-type memory devices 1100c and 1100d of FIGS. 3A and 3B are illustrated for explaining reference numeral 10 of FIG. 1. Particularly, FIGS. 3A and 3B may be diagrams for describing the ground selection transistor GST and the memory cell MC1 of FIG. 1. FIGS. 3A and 3B may be the same as each other except for composition materials of the etch control layers 406x and 406.

Compared to the vertical-type memory devices 1100a and 1100b of FIGS. 2A and 2B, the vertical-type memory devices 1100c and 1100d of FIGS. 3A and 3B may be the same as the vertical-type memory devices 1100a and 1100b except that a thickness T3 of a first replacement gate electrode 464T is greater than the thickness T2 of the second replacement gate electrode 466. When the thickness T3 of the first replacement gate electrode 464T is greater than the thickness T2 of the second replacement gate electrode 466, the channel layer 454 and the first gate insulation portion 448a may be formed in the recess side groove 446 under the etch control layer 406. When the channel layer 454 is formed in the recess side groove 446, characteristics of the ground selection transistor GST may improve.

If necessary, the thickness T3 of the first replacement gate electrode 464T may be less than the thickness T2 of the second replacement gate electrode 466. As a result, in the vertical-type memory devices 1100c and 1100d according to the present disclosure, the thickness T3 of the first replacement gate electrode 464T may differ from the thickness T2 of the second replacement gate electrode 466.

FIGS. 4 to 19 are diagrams for describing a vertical-type memory device and a manufacturing method thereof, according to aspects of the present disclosure.

In detail, FIGS. 10, 11, 12, and 15 are cross-sectional views including cross-sections taken along line b-b of FIGS. 16-19, respectively. Also, FIGS. 16-19 are plan views taken along line a-a of FIGS. 10, 11, 12, and 15, respectively.

Figure 4:
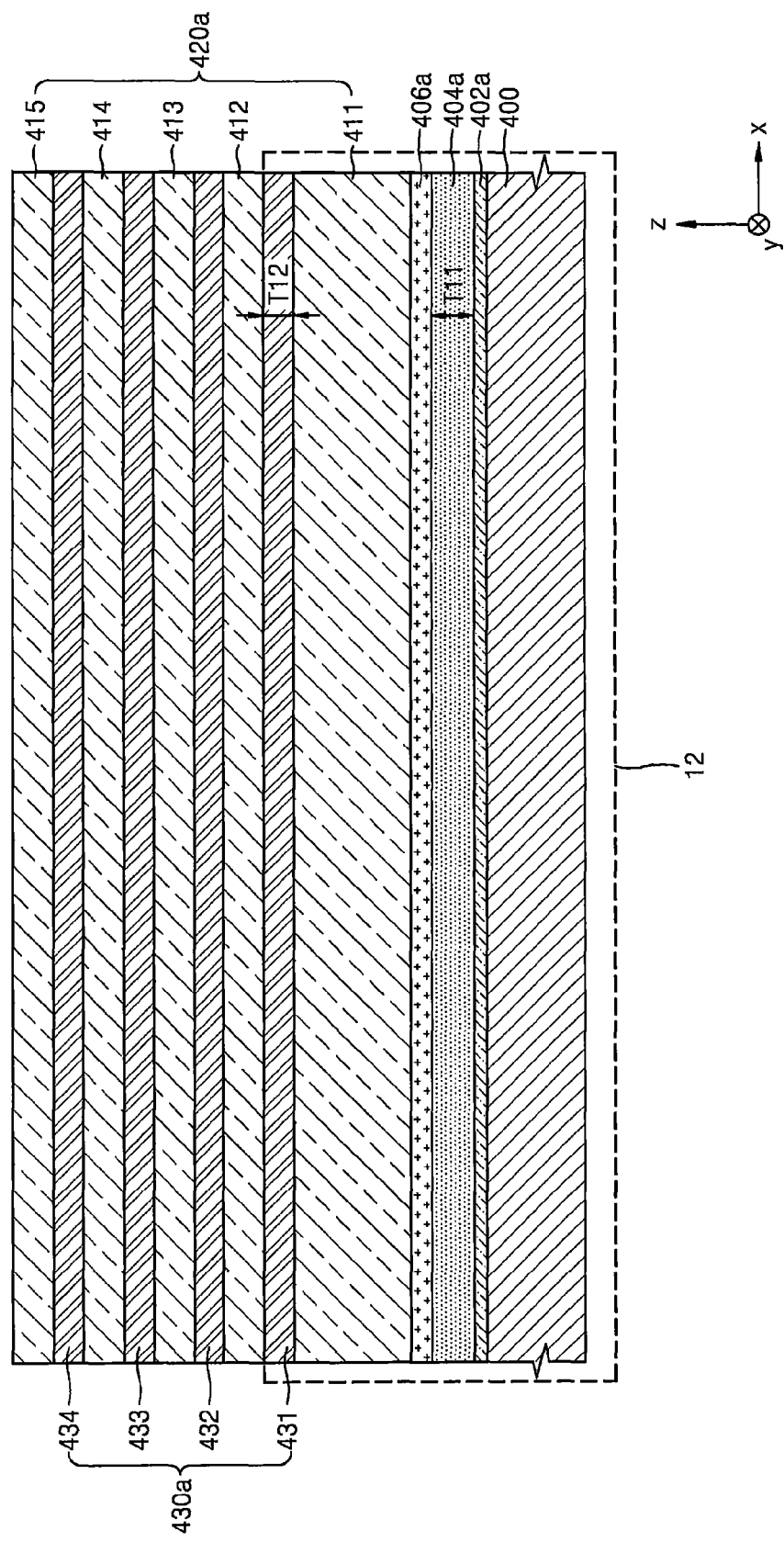
FIGS. 4 to 19 are diagrams for describing a vertical-type memory device and a manufacturing method thereof, according to aspects of the present disclosure.

Referring to FIG. 4, the substrate 400, which may include a single crystal semiconductor material, is prepared. The substrate 400 may be, for example, a single crystal silicon substrate. The single crystal silicon substrate may refer to a single crystal silicon wafer, for example, a P-type single crystal silicon wafer.

If necessary, an impurity region (not shown), for example, an N-type impurity region, that is used as the common source line CSL may be formed by doping a surface region of the substrate 400 with N-type impurities. The impurity region may be formed by doping under a surface of the substrate 400 with N-type impurities. If necessary, an impurity region that is formed as the common source line CSL may be formed by selectively doping a substrate surface that is under an isolating insulation layer with N-type impurities in a subsequent process.

A pad insulation material layer 402a may be formed on the substrate 400. The pad insulation material layer 402a may include an oxide layer. The substrate 400 may be thermally oxidized, or an oxide film may be deposited by a chemical vapor deposition method to form the pad insulation material layer 402a. The pad insulation material layer 402a may be provided to suppress stress that occurs when a material layer that is formed subsequently directly contacts the substrate 400.

A first etch control material layer 404a and a second etch control material layer 406a may be sequentially formed on the pad insulation material layer 402a. Each of the first etch control material layer 404a and the second etch control material layer 406a may include a material layer, for example, a polysilicon layer, that may be etched by one etchant. The first etch control material layer 404a and the second etch control material layer 406a may include material layers having etch selectivity with respect to each other.

In detail, the first etch control material layer 404a may be formed on the pad insulation material layer 402a. The first etch control material layer 404a may include a polysilicon layer not doped with impurities or a polysilicon layer doped with N-type impurities or P-type impurities. The N-type impurities may be phosphorus (P) or arsenic (As). The P-type impurities may be boron (B).

The second etch control material layer 406a may be formed on the first etch control material layer 404a. The second etch control material layer 406a may be formed of a material having etch selectivity with respect to the first etch control material layer 404a. The second etch control material layer 406a may include a polysilicon layer doped with carbon, P-type impurities, or N-type impurities.

For example, when the first etch control material layer 404a includes a polysilicon layer not doped with impurities, the second etch control material layer 406a may include a polysilicon layer doped with carbon, P-type impurities, or N-type impurities. When the first etch control material layer 404a includes a polysilicon layer doped with N-type impurities, the second etch control material layer 406a may include a polysilicon layer doped with carbon or P-type impurities.

The first etch control material layer 404a may be formed thicker than the second etch control material layer 406a. The first etch control material layer 404a may be removed in a subsequent process. A thickness of the first etch control material layer 404a may correspond to a thickness of a replacement gate electrode in a subsequent process.

Material layers 411 to 415 and 431 to 434 respectively constituting an interlayer insulation material layer 420a and a sacrificial material layer 430a are alternately repeatedly stacked on the second etch control material layer 406a a plurality of times. The sacrificial material layer 430a and the interlayer insulation material layer 420a may be formed by chemical vapor deposition processes. A thickness T11 of the first etch control material layer 404a may be the same as a thickness T12 of the sacrificial material layer 430a.

The sacrificial material layer 430a may be formed of a material having etch selectivity with respect to each of the interlayer insulation material layer 420a and single crystal silicon. Also, the sacrificial material layer 430a may be formed of a material that may be easily removed by a wet etching process. In the present embodiment, the sacrificial material layer 430a may include a silicon nitride layer. The interlayer insulation material layer 420a may include a silicon oxide layer.

In some embodiments according to FIG. 4, the interlayer insulation material layers 411 and 415 may be formed on the top and the bottom of the structure including repeatedly stacked layers. The sacrificial material layer 430a may be removed in a subsequent process, and may define, for each layer, a portion where a replacement gate electrode is to be formed.

The number of individual material layers constituting the sacrificial material layer 430a and the interlayer insulation material layer 420a may be equal to or greater than the number of memory cells and string selection transistors included in a unit cell string. In some embodiments according to FIG. 4, the first to fourth sacrificial material layers 431 to 434 and the first to fifth interlayer insulation material layers 411 to 415 that are alternately stacked on each other are illustrated for convenience.

When the number of memory cells or string selection transistors included in one unit cell string is greater than the number of individual material layers constituting the sacrificial material layer 430a and the interlayer insulation material layer 420a, more individual material layers constituting the sacrificial material layer 430a and the interlayer insulation material layer 420a may be additionally stacked.

Figure 5:
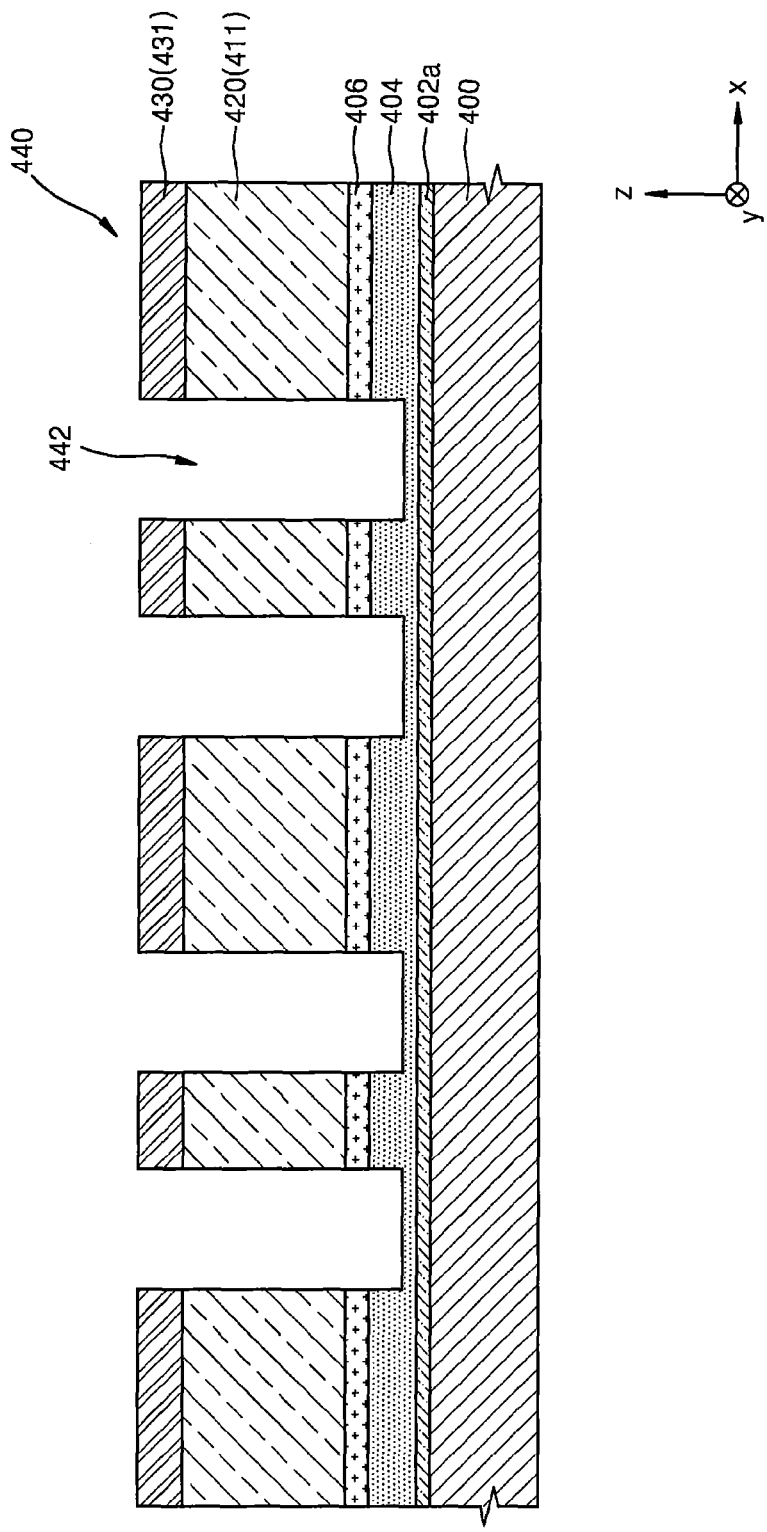

Referring to FIG. 5, a photoresist pattern (not shown) may be formed on an uppermost interlayer insulation material layer (415 of FIG. 4). Next, a sacrificial material layer (430a of FIG. 4), an interlayer insulation material layer (420a of FIG. 4), a second etch control material layer (406a of FIG. 4), and a first etch control material layer (404a of FIG. 4) may be sequentially etched using the photoresist pattern as an etching mask.

Thus, stack structures 440 including a plurality of first opening portions 442 may be formed as illustrated in FIG. 5. In FIG. 5 and the following drawings, only a region denoted by reference numeral 12 of FIG. 4 is illustrated for convenience in order to describe the technical spirit of the present disclosure more easily.

A stack structure 440 may include a sacrificial layer 430, an interlayer insulation layer 420, the second etch control layer 406, and the first etch control layer 404. The plurality of first opening portions 442 may be formed to zigzag in a second direction (direction y). When a first opening portion 442 is formed, the second etch control material layer (406a of FIG. 4) and the first etch control material layer (404a of FIG. 4) may be etched using a polysilicon etchant. Thus, the first opening portions 442 may be uniformly formed. If necessary, the bottom of the first opening portion 442 may be formed such that a surface of the pad insulation material layer 402a is not exposed, and a portion of the first etch control layer 404 may remain.

In order to form a vertical-type memory device that is highly integrated, the first opening portion 442 may be configured to have a minimum width that may be formed by a photo process. A pillar-type channel layer or a hollow cylinder-type channel layer may be formed in the first opening portion 442 by a subsequent process. Accordingly, the first opening portion 442 may be referred to as a channel hole. The first opening portion 442 may be easily formed due to the second etch control material layer (406a of FIG. 4) and the first etch control material layer (404a of FIG. 4).

Figure 6:
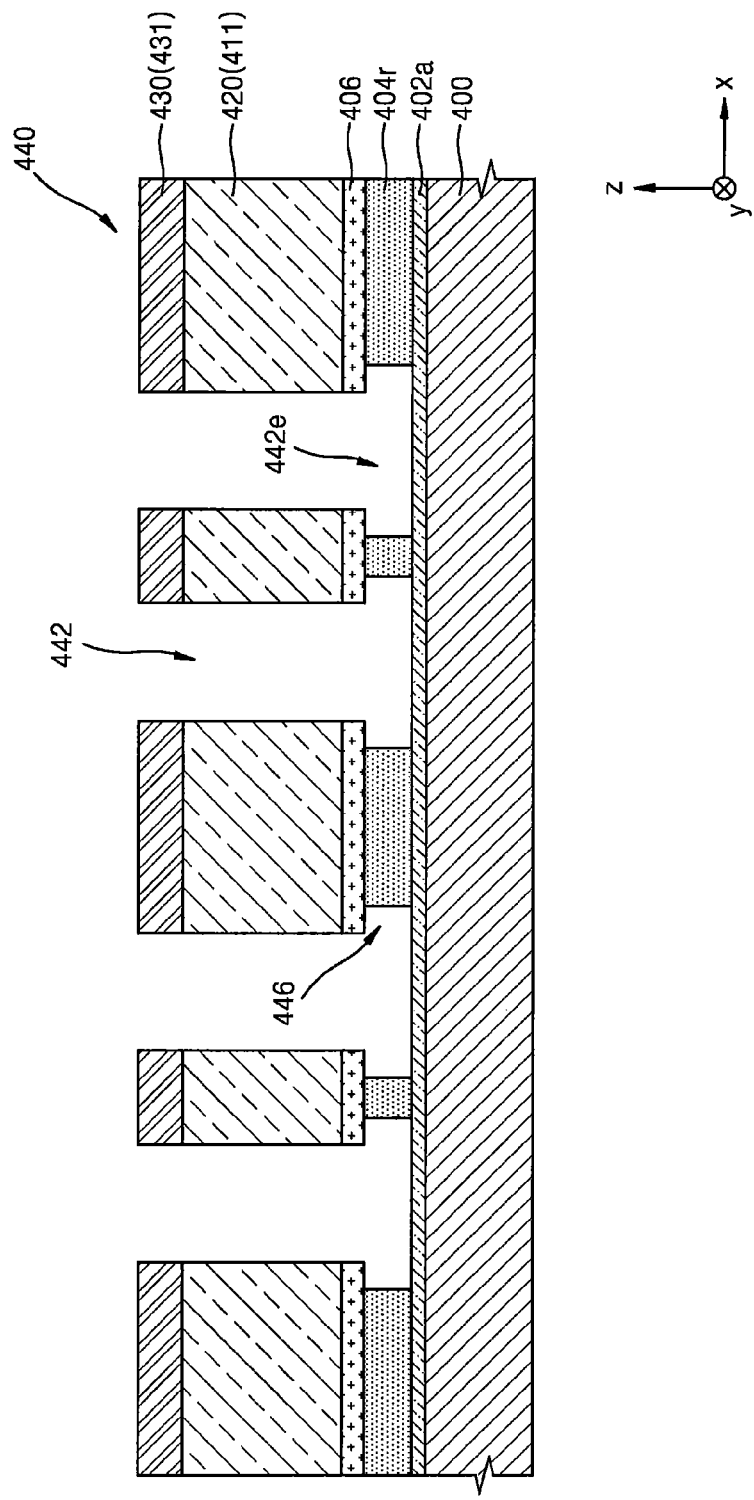

Referring to FIG. 6, a first etch control layer (404 of FIG. 5) is further etched to form an extended first opening portion 442e. The first etch control layer (404 of FIG. 5) that contacts the first opening portion 442 is further etched via the first opening portion 442 by a polysilicon etchant to form the extended first opening portion 442e.

Since a second etch control layer (406 of FIG. 5) has etch selectivity with respect to the first etch control layer (404 of FIG. 5), the extended first opening portion 442e may be formed by easily etching the first etch control layer (404 of FIG. 5). As the extended first opening portion 442e is formed, a recess side groove 446 (recess side surface groove) may be formed under the second etch control layer 406 and on a side of the first etch control layer 404. As the recess side groove 446 is formed, the first etch control layer 404 may be changed into a first etch control layer 404r having a recessed side at the extended first opening portion 442e.

The first opening portion 442 and the extended first opening portion 442e may be easily formed due to the second etch control material layer (406a of FIG. 4) and the first etch control material layer 404a. Thus, according to the present disclosure, a silicon epi-layer that contacts the substrate 400 may be omitted from under the first opening portion 442 and the extended first opening portion 442e in a subsequent process.

Figure 7:
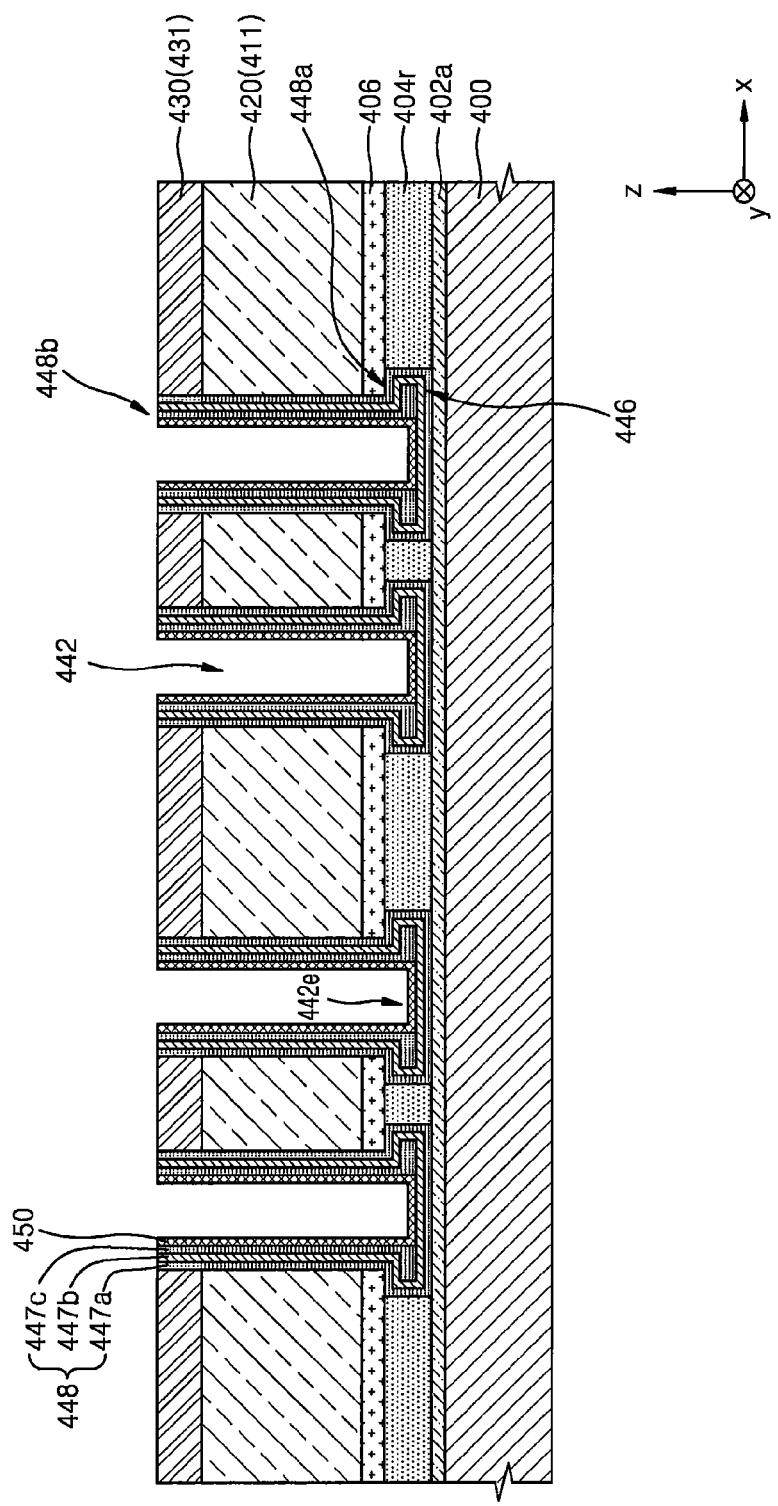

Referring to FIG. 7, the gate insulation layer 448 and a spacer layer 450 may be formed in the first opening portion 442 and the extended first opening portion 442e. The gate insulation 448 may include the first gate insulation portion 448a on an inner wall of the extended first opening portion 442e and a second gate insulation portion 448b on an inner wall of the first opening portion 442. In other words, as illustrated in FIG. 7, the second gate insulation portion 448b may be formed on inner walls of the second etch control material layer 406, the interlayer insulation layer 420, and the sacrificial layer 430.

The first gate insulation portion 448a may be formed in the recess side groove 446. The first gate insulation portion 448a may be included in a ground selection transistor. The second gate insulation portion 448b may be included in a memory cell or a string cell transistor.

The gate insulation layer 448 may include a blocking insulation layer 447a, a charge storage layer 447b, and a tunnel insulation layer 447c. The blocking insulation layer 447a may be formed on the inner walls of the first opening portion 442 and the extended first opening portion 442e. The blocking insulation layer 447a may include a silicon oxide layer. The blocking insulation layer 447a may be formed by a chemical vapor deposition process.

The charge storage layer 447b is formed along a surface of the blocking insulation layer 447a. The charge storage layer 447b may be formed by a chemical vapor deposition method. The charge storage layer 447b may be formed by depositing silicon nitride or metal oxide. The tunnel insulation layer 447c is formed on a surface of the charge storage layer 447b. The tunnel insulation layer 447c may be formed by depositing silicon oxide or metal oxide.

Next, the spacer layer 450 may be formed on the tunnel insulation layer 447c over the length of the first opening portion 442 and the extended first opening portion 442e. The spacer layer 450 may be formed of a material having etch selectivity with respect to the gate insulation layer 448. The spacer layer 450 may include a polysilicon layer. The spacer layer 450 may protect the gate insulation layer 448 in a subsequent process.

Figure 8:
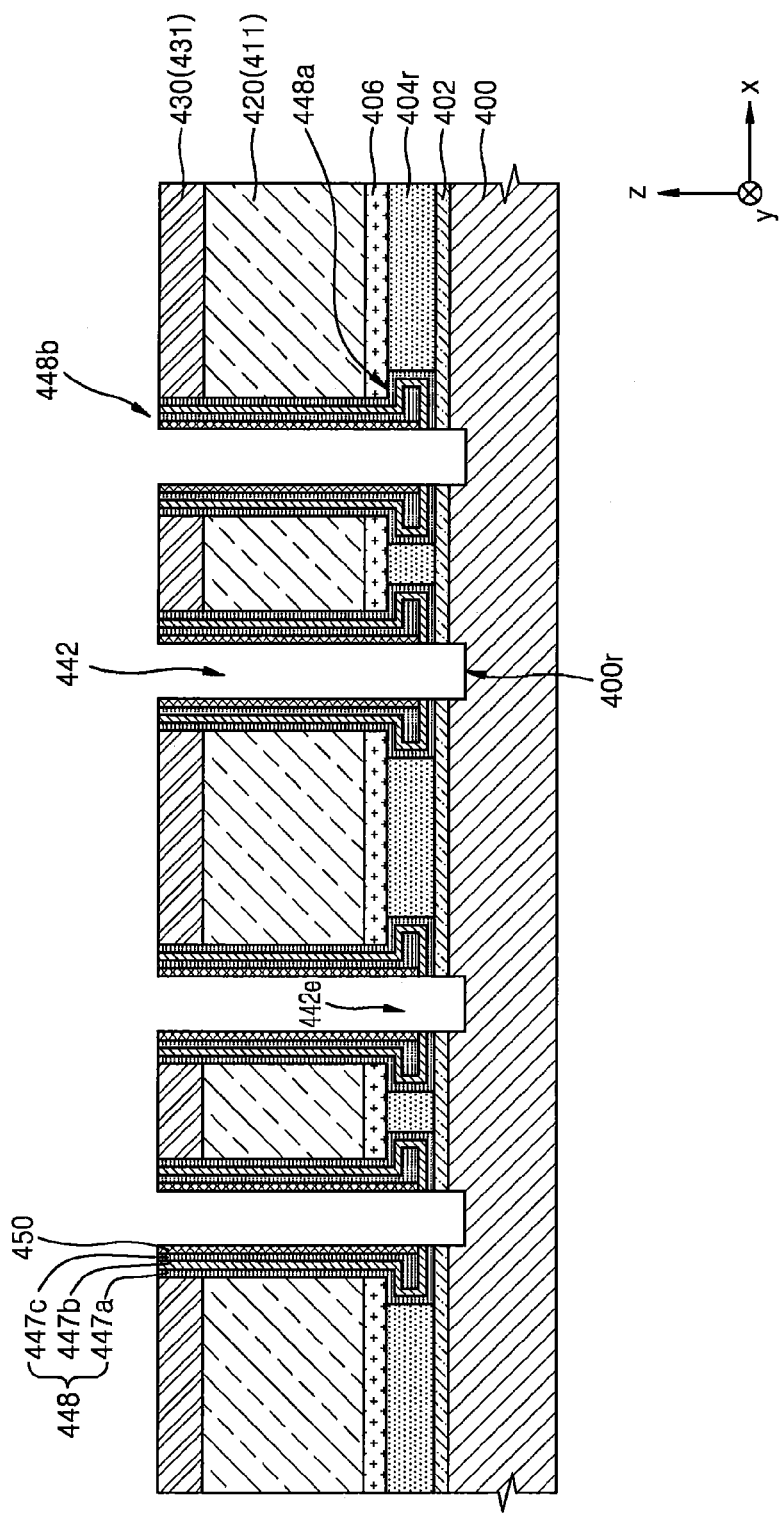

Referring to FIG. 8, a gate insulation layer (448 of FIG. 7) and a pad insulation material layer (402a of FIG. 7) at the bottom of the first opening portion 442 and the extended first opening portion 442e are etched by using the spacer layer 450 as an etching mask.

Thus, the first opening portion 442 and the extended first opening portion 442e may expose a surface of the substrate 400. In addition, the recess 400r may be formed in the substrate 400 by sufficiently etching the pad insulation material layer 402a, and the pad insulation material layer 402a may be a pad insulation layer 402 that exposes the substrate 400.

Figure 9:
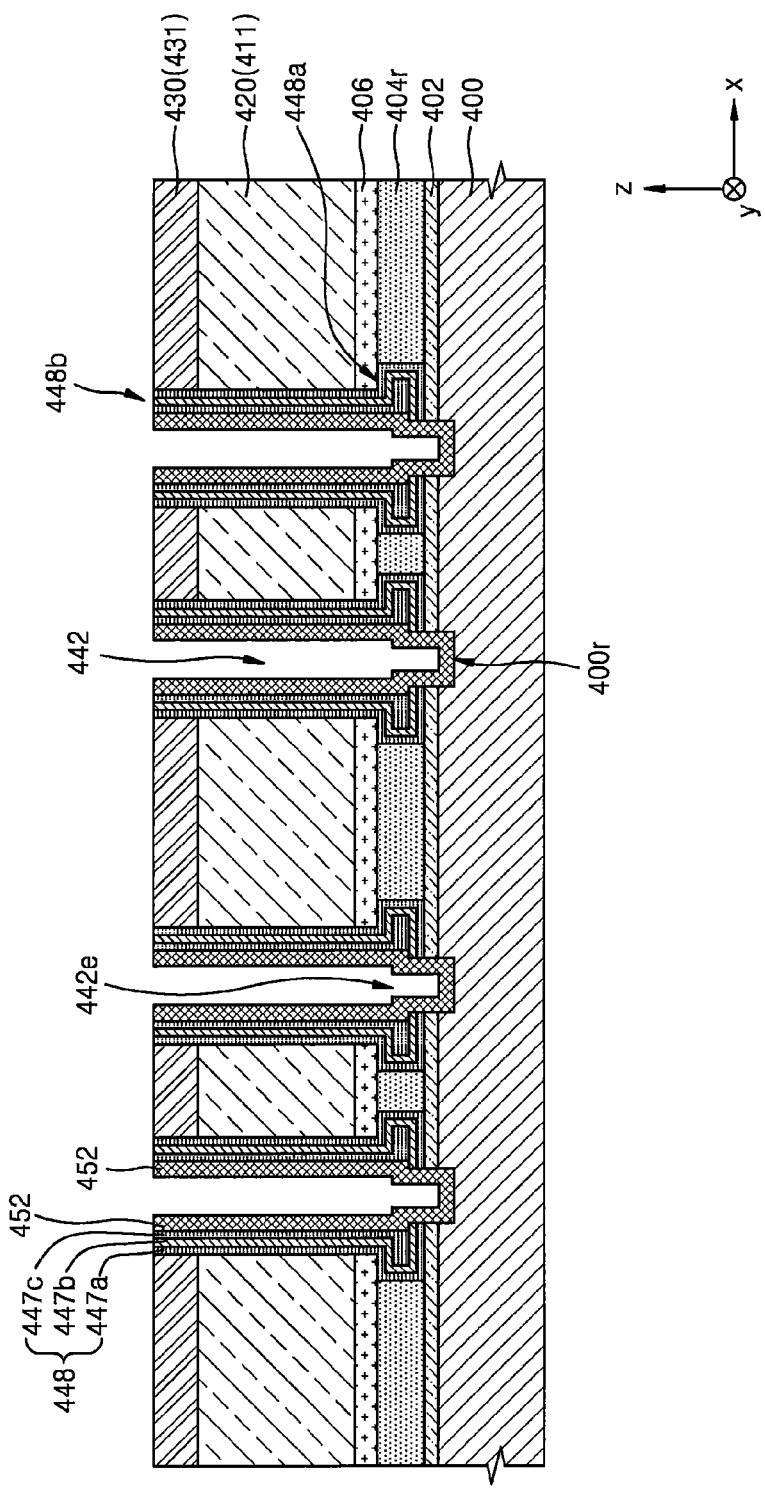

Referring to FIG. 9, a spacer layer (450 of FIG. 8) on side walls of the first opening portion 442 and the extended first opening portion 442e may be removed. The spacer 450 may be removed with a polysilicon etchant.

A preliminary channel layer 452 may be formed on the gate insulation layer 448 in the first opening portion 442 and the extended first opening portion 442e. The preliminary channel layer 452 may contact the substrate 400. The preliminary channel layer 452 may be formed in the recess 400r of the substrate 400 as well. The preliminary channel layer 452 may include a silicon layer. The preliminary channel layer 452 may include a single crystal silicon layer or a polysilicon layer.

Figure 10:
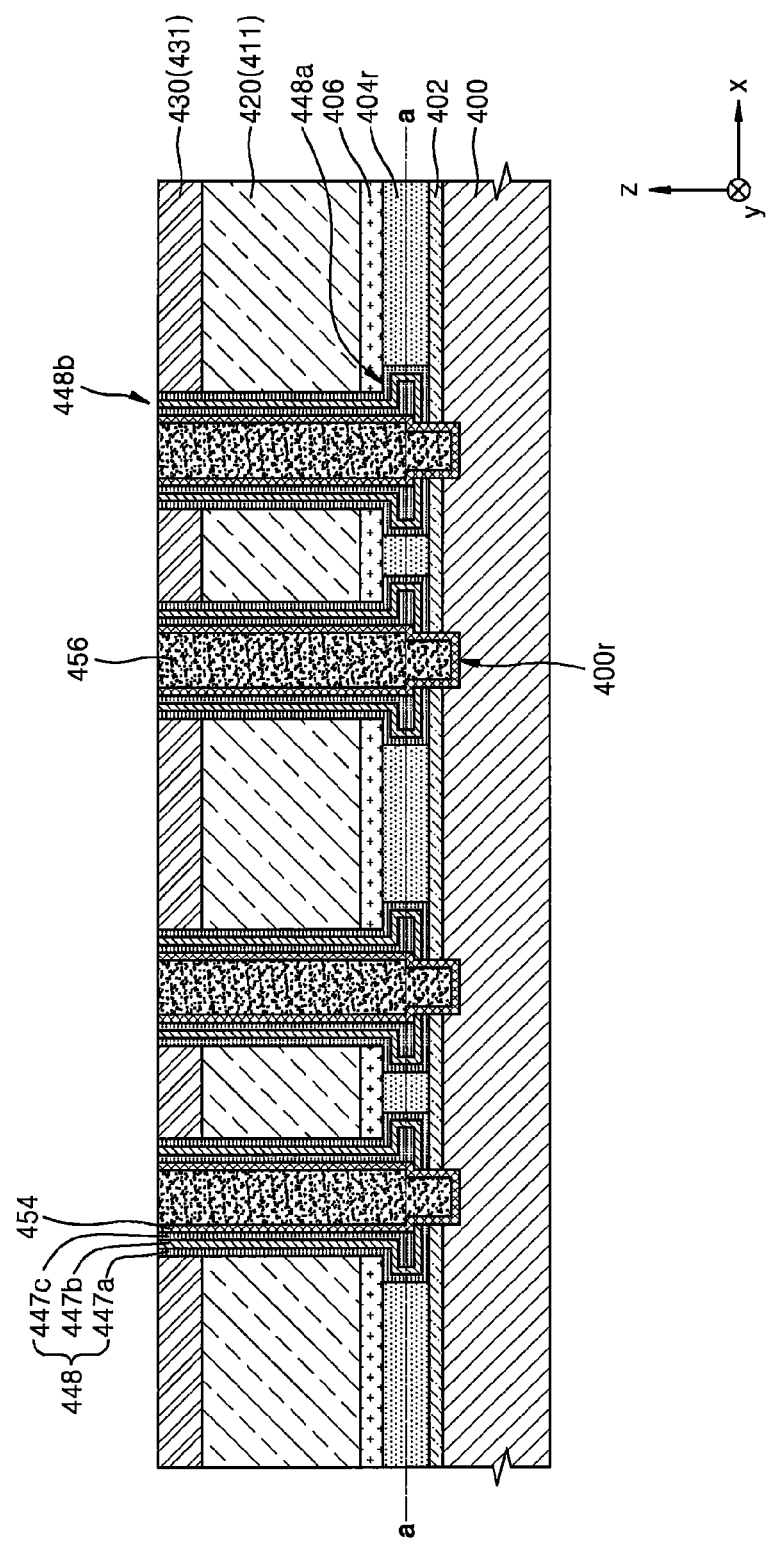
Figure 16:
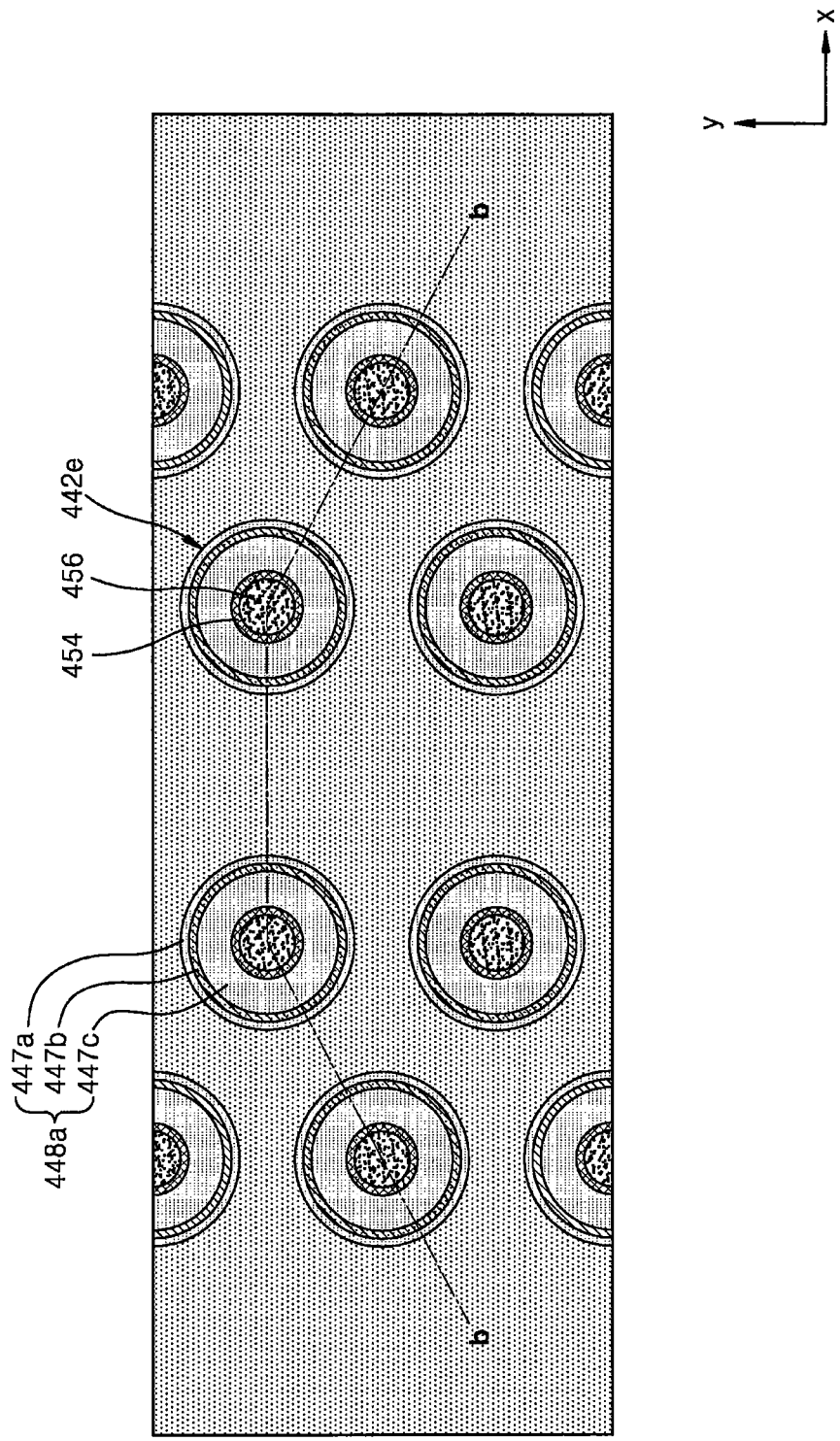

Referring to FIGS. 10 and 16, the channel layer 454 may be formed by trimming the preliminary channel layer 452. The channel layer 454 may be an active region of a vertical-type memory device. The trimming process may be a process of etching a portion of the preliminary channel layer 452. Through the trimming process, the channel layer 454 may be uniformly formed on the gate insulation layer 448 on the inner walls of the first opening portion 442 and the extended first opening portion 442e and the bottom of the substrate 400. The trimming process is an optional process and may not be performed if necessary.

Next, the filling insulation layer 456 may be formed on the channel layer 454 in the first opening portion 442. The filling insulation layer 456 may form an oxide layer. The filling insulation layer 456 may be formed to insulate ground selection transistors, memory cells, and the like from each other. Thus, the channel layer 454 may be a cylindrical column that has the internal first opening portion 442 filled with the filling insulation layer 456.

Figure 11:
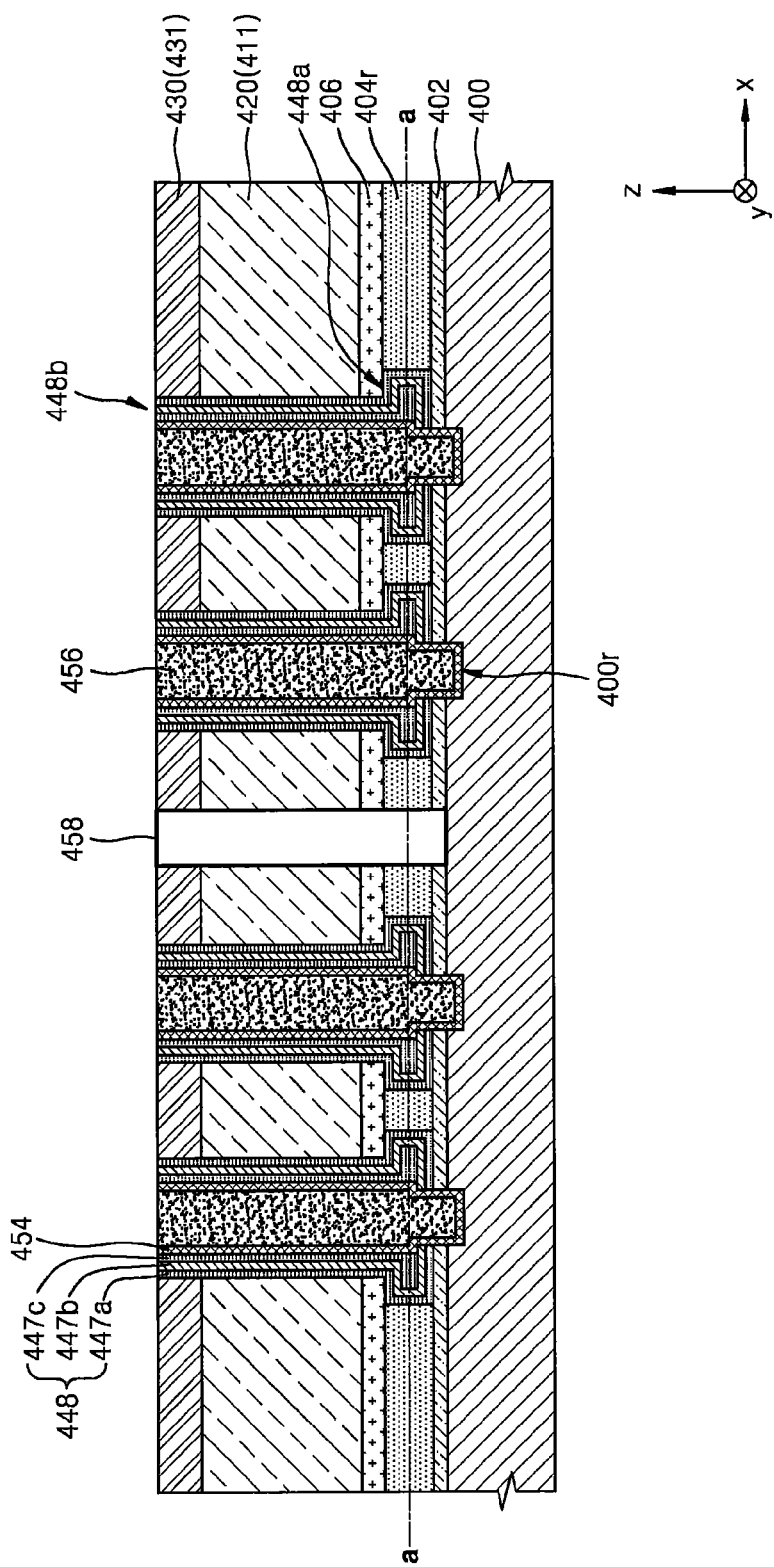
Figure 17:
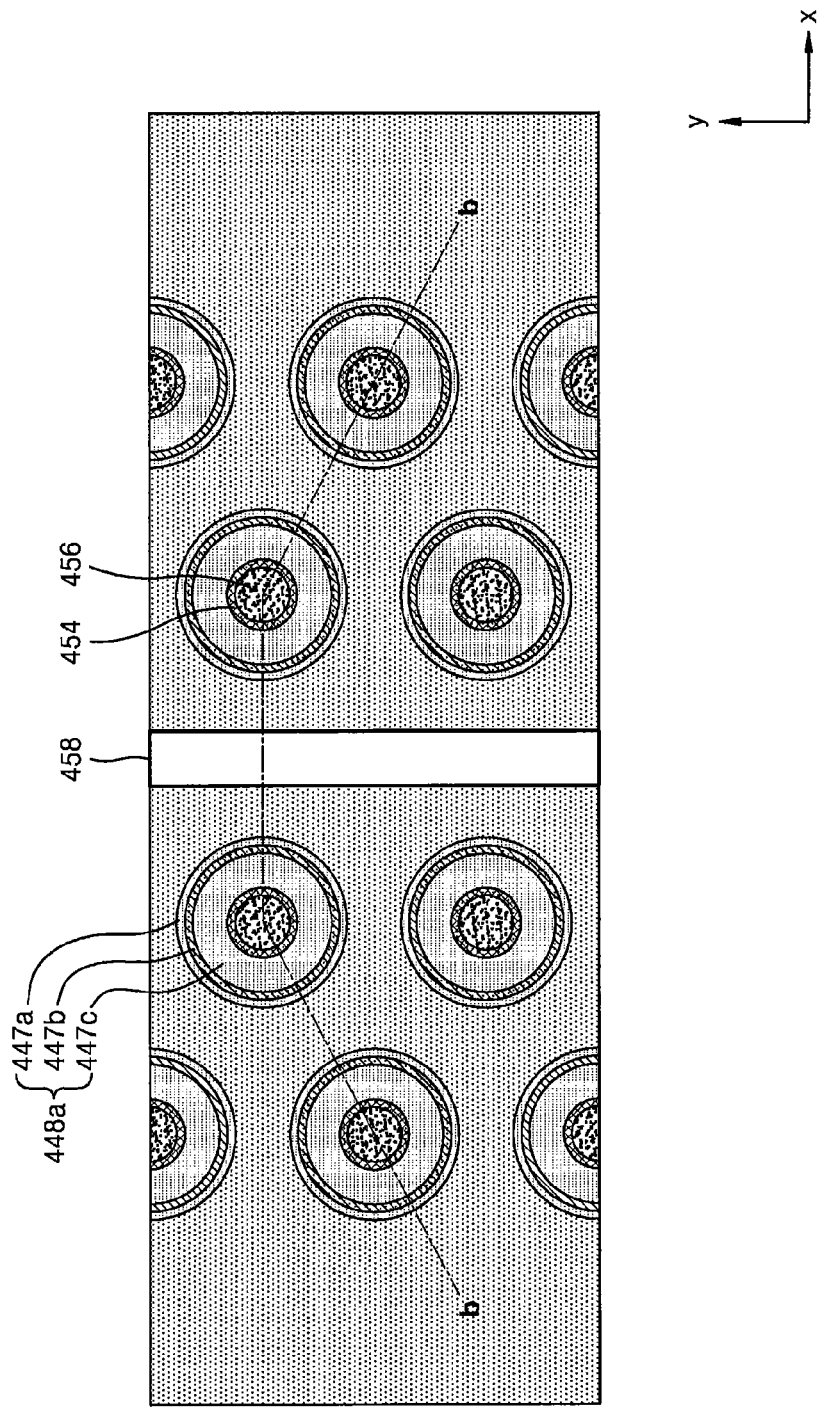

Referring to FIGS. 11 and 17, the sacrificial layer 430, the interlayer insulation layer 420, the second etch control layer 406, the recessed first etch control layer 404r, and the pad insulation layer 402 may be sequentially etched by a photolithography process to form a second opening portion 458. As the second opening portion 458 is formed, the recessed first etch control layer 404r, the sacrificial layer 430, the interlayer insulation layer 420, and the second etch control layer 406 may be divided for each region on the substrate 400.

The second opening portion 458 may be filled with an insulation layer later and thus may be a separation region. As the second opening portion 458 is formed, the recessed first etch control layer 404r and the sacrificial layer 430 may be removed by a subsequent process to form a replacement gate electrode. Although FIGS. 11 and 17 illustrate the second opening portion 458 formed between two channel layers 454 for convenience, the second opening portion 458 may be formed between more than two channel layers 454 if necessary.

Figure 12:
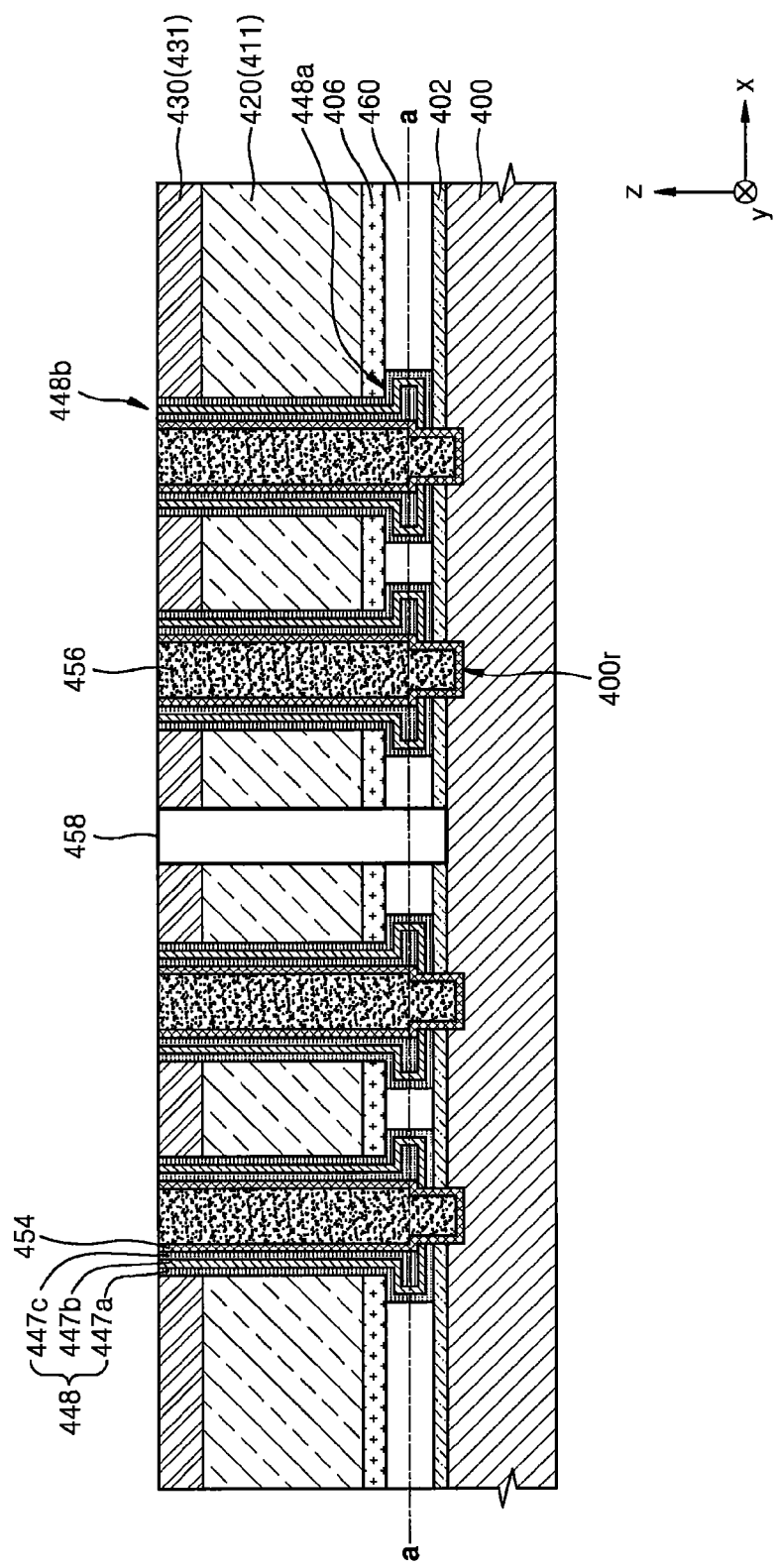
Figure 18:
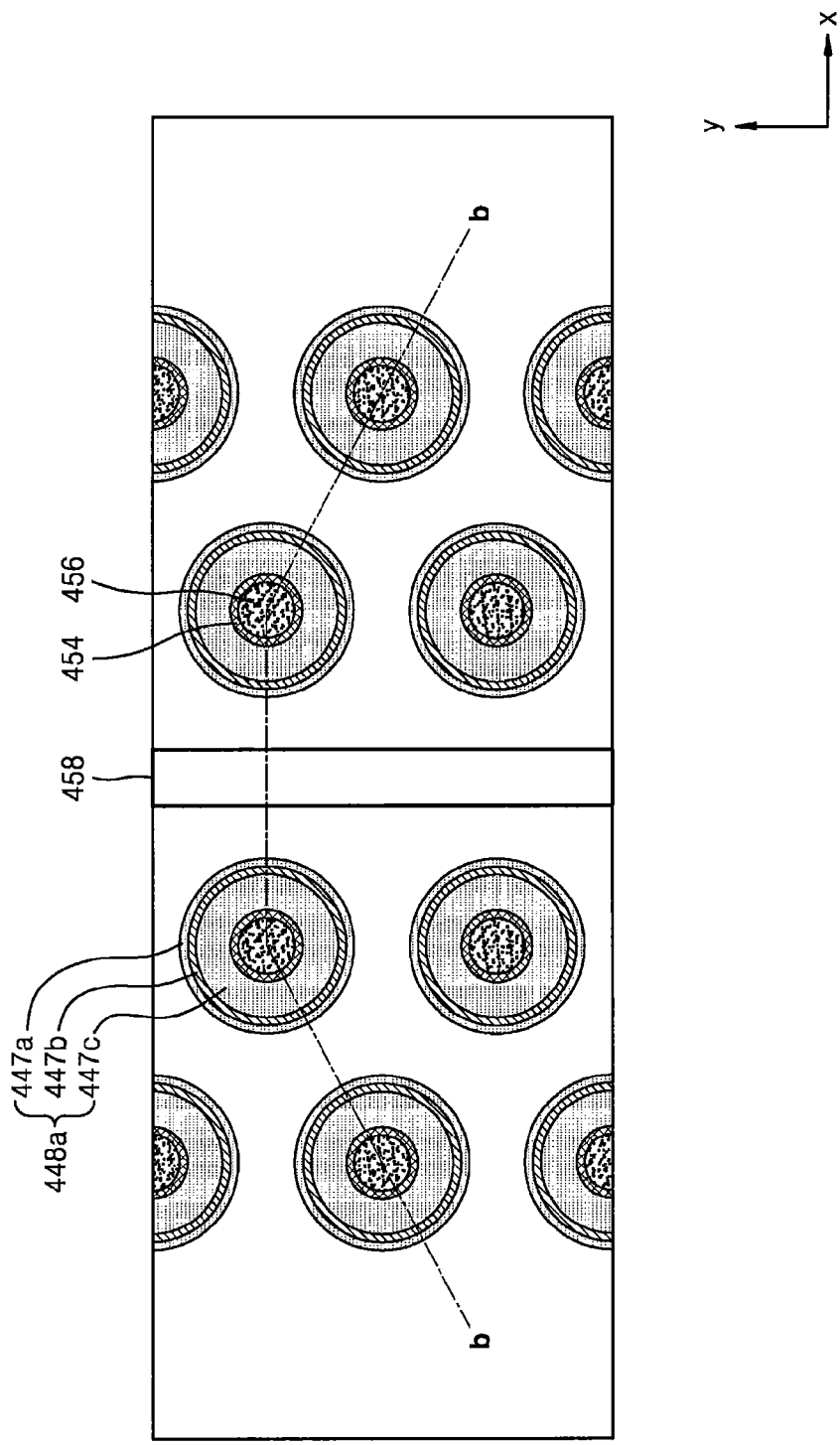

Referring to FIGS. 12 and 18, the first rib groove 460 that is connected to flanks of the second opening portion 458 may be formed by removing the recessed first etch control layer 404r exposed by the second opening portion 458 through a wet etching process. The recessed first etch control layer 404r may be etched with a polysilicon etchant.

Since the recessed first etch control layer 404r has etch selectivity compared with the second etch control layer 406, the recessed first etch control layer 404r may be easily removed by using a polysilicon etchant.

Figure 13:
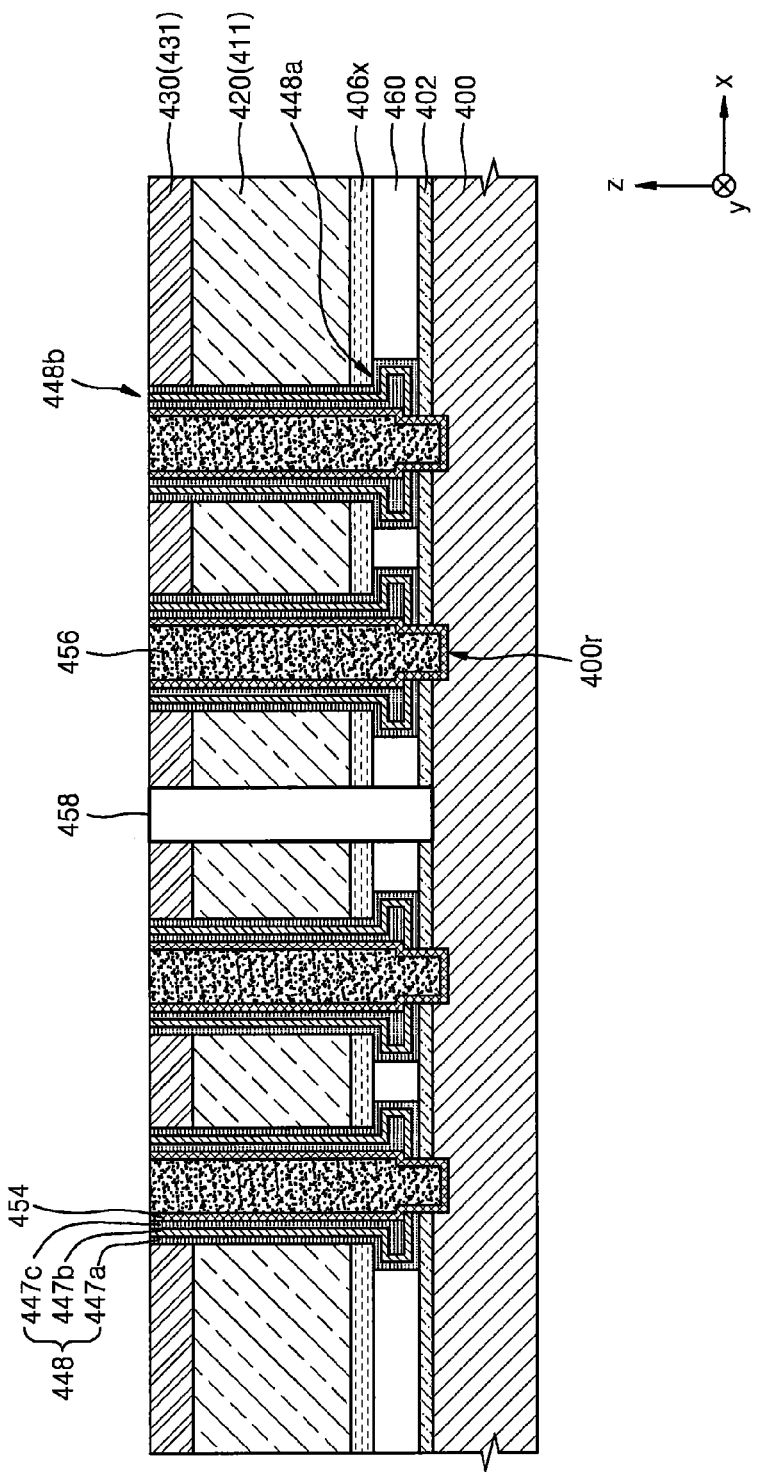
Figure 14:
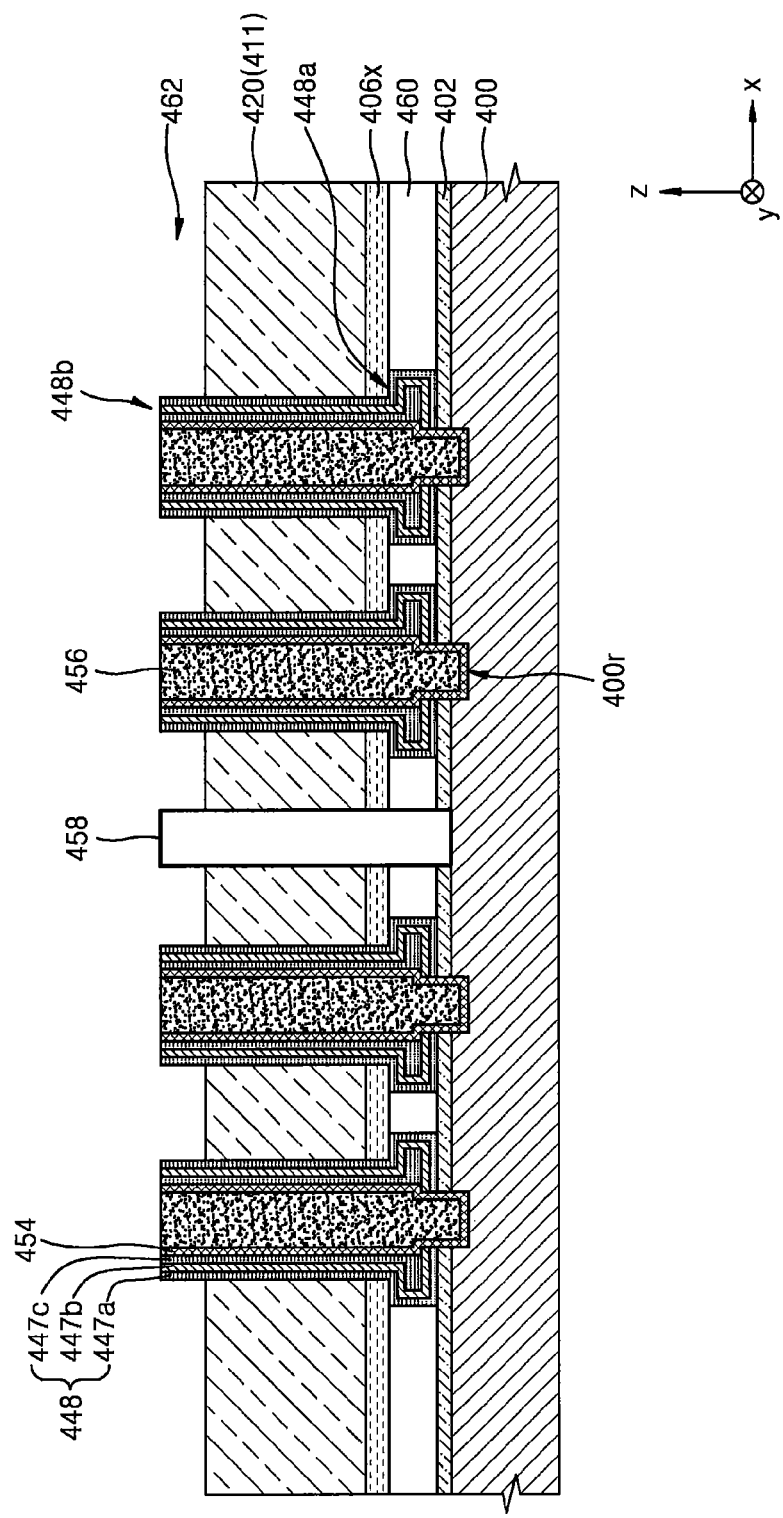

Referring to FIGS. 13 and 14, as illustrated in FIG. 13, an oxidized second etch control layer 406x is formed by oxidizing the second etch control layer 406 exposed by the second opening portion 458 and the first rib groove 460. The oxidized second etch control layer 406x may be formed of a polysilicon oxide layer including carbon, N-type impurities, or P-type impurities.

Next, as illustrated in FIG. 14, the second rib groove 462 that is connected to flanks of the second opening portion 458 is formed on an upper surface of the interlayer insulation layer 420 by removing the sacrificial layer 430 exposed by the second opening portion 458 through a wet etching process. As discussed above, the cross-sectional view of FIG. 14 illustrates a portion 12 of FIG. 4, and above the removed sacrificial layer 430 may be a second interlayer insulation layer 420. When such a removal process is performed, the interlayer insulation layer 420 that extends in a first direction, e.g., z direction is formed on the gate insulation layer 448 on the channel layer 454. By a subsequent process, a ground selection transistor and a memory cell may be respectively formed in the first rib groove 460 and the second rib groove 462.

Figure 15:
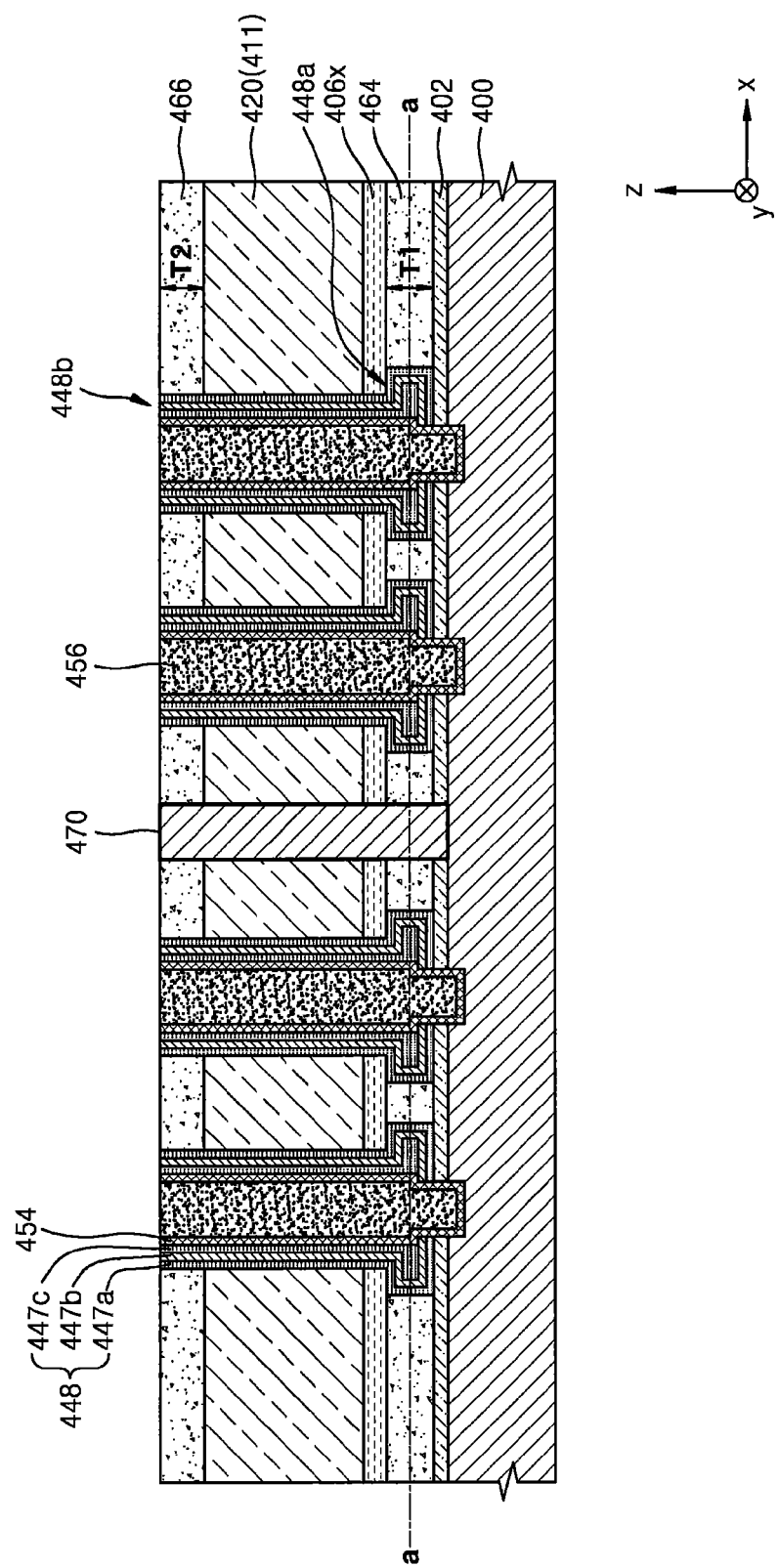
Figure 19:
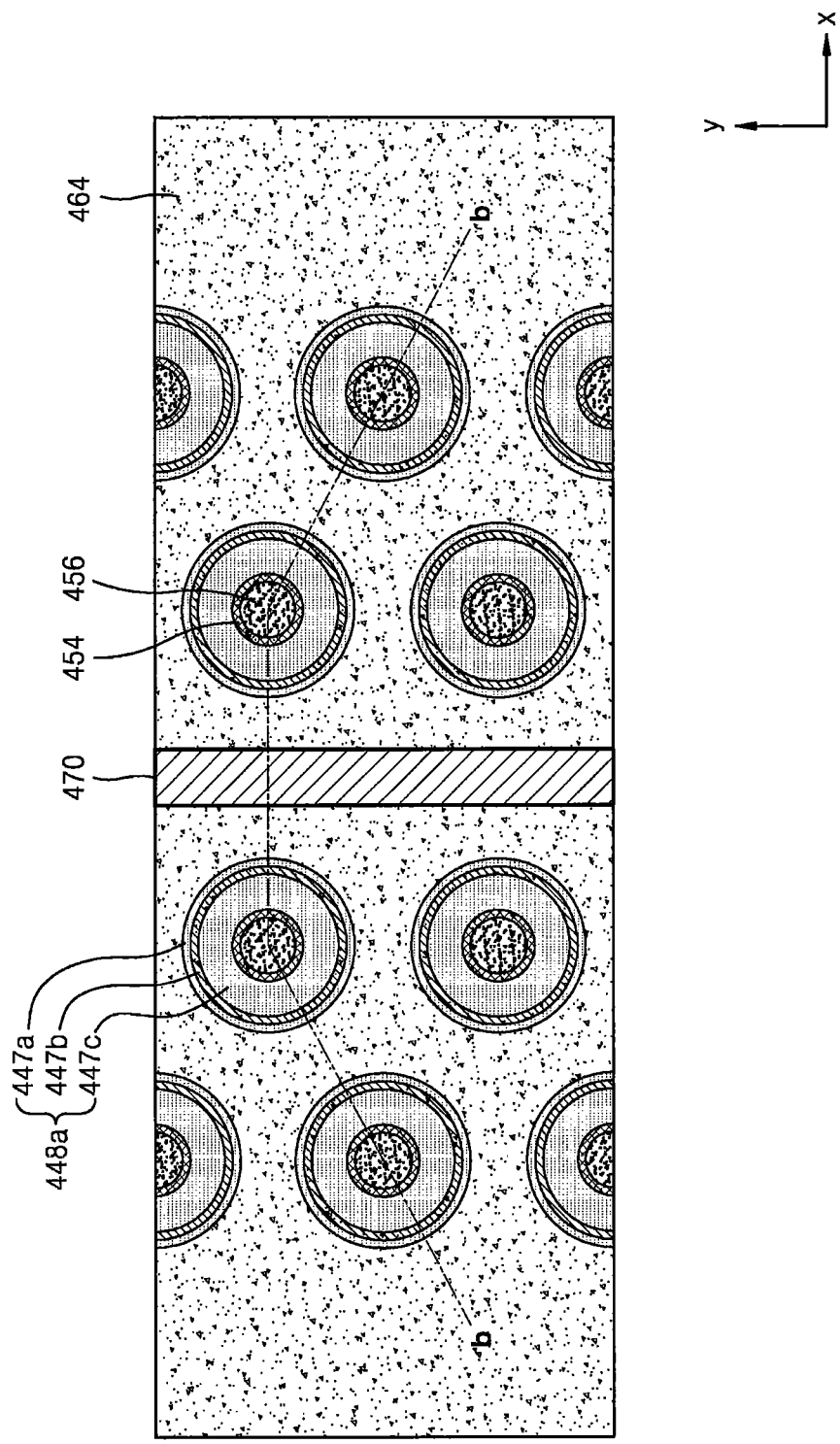

Referring to FIGS. 15 and 19, the first replacement gate electrode 464 and the second replacement gate electrode 466 are formed on sides of the blocking insulation layer 447a to respectively fill the first rib groove 460 and the second rib groove 462. In order for the first replacement gate electrode 464 and the second replacement gate electrode 466 to fill the first rib groove 460 and the second rib groove 462 without a void, a conductive material having good step coverage characteristics may be used to form the first replacement gate electrode 464 and the second replacement gate electrode 466. Each of the first replacement gate electrode 464 and the second replacement gate electrode 466 may include a metal layer, for example, tungsten (W).

As described above, in some embodiments according to FIGS. 15 and 19, replacement gate electrodes 464 and 466 may be formed by a gate replacement process in which the first rib groove 460 and the second rib groove 462 that define regions where gate electrodes are to be formed are filled with a conductive material. Since the thickness T11 of the first etch control material layer 404a is formed to be the same as the thickness T12 of the sacrificial material layer 430a during the aforementioned manufacturing process, the thickness T1 of the first replacement gate electrode 464 may be the same as the thickness T2 of the second replacement gate electrode 466.

When the thickness T1 of the first replacement gate electrode 464 is configured to be the same as the thickness T2 of the second replacement gate electrode 466, the first replacement gate electrode 464 and the second replacement gate electrode 466 may be simultaneously formed by one process. Thus, manufacturing processes may be simplified, and device manufacturing costs may be decreased.

If necessary, an impurity region (not shown) that is used as the common source line CSL may be formed in the substrate 400 exposed by the second opening portion 458. The impurity region may be formed by doping under a surface of the substrate 400 with N-type impurities. Next, an isolating insulation layer 470 may be formed by forming an insulating material in the second opening portion 458.

Figure 20:
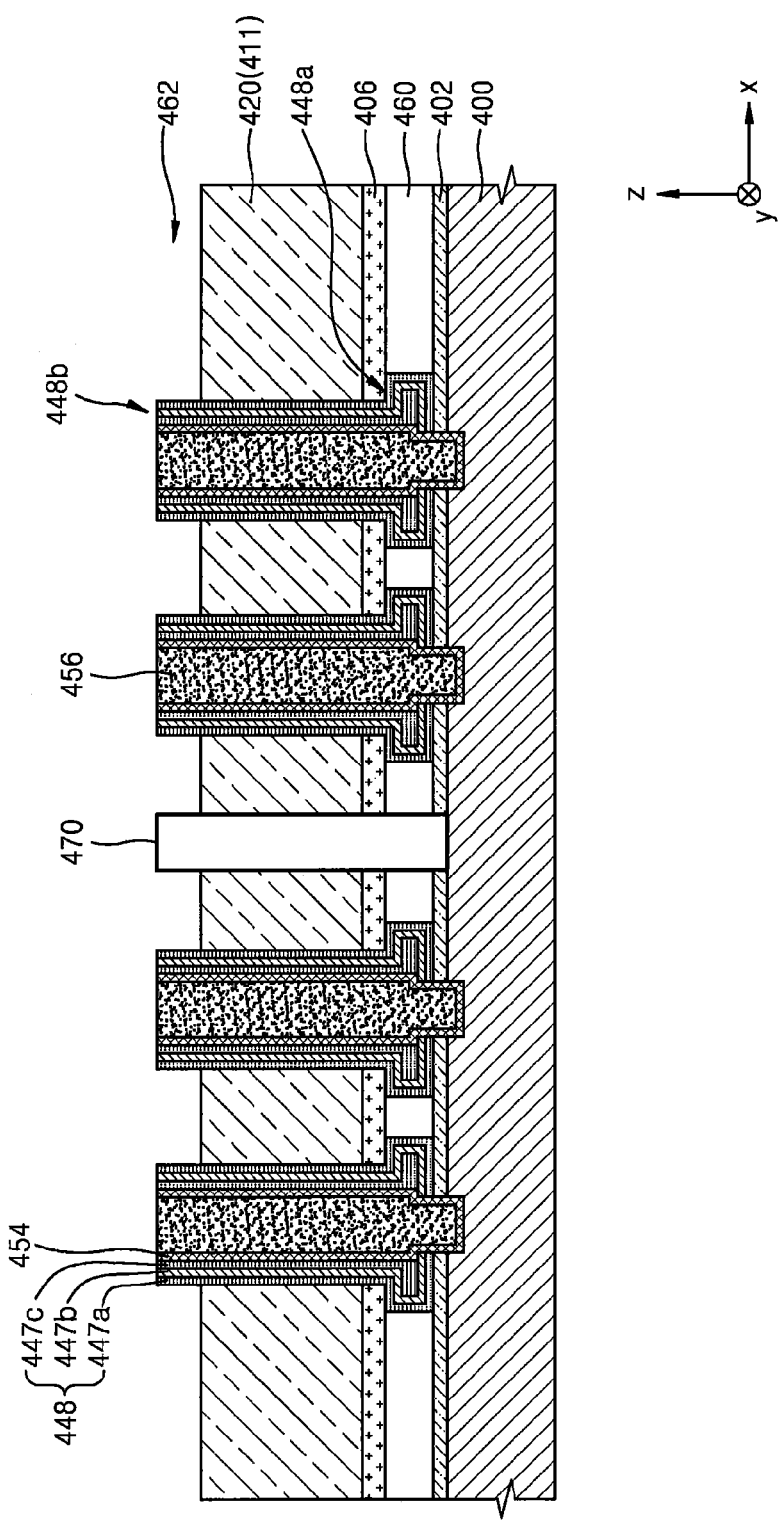
FIGS. 20 and 21 are cross-sectional views for describing a vertical-type memory device and a manufacturing method thereof, according to aspects of the present disclosure.
Figure 21:
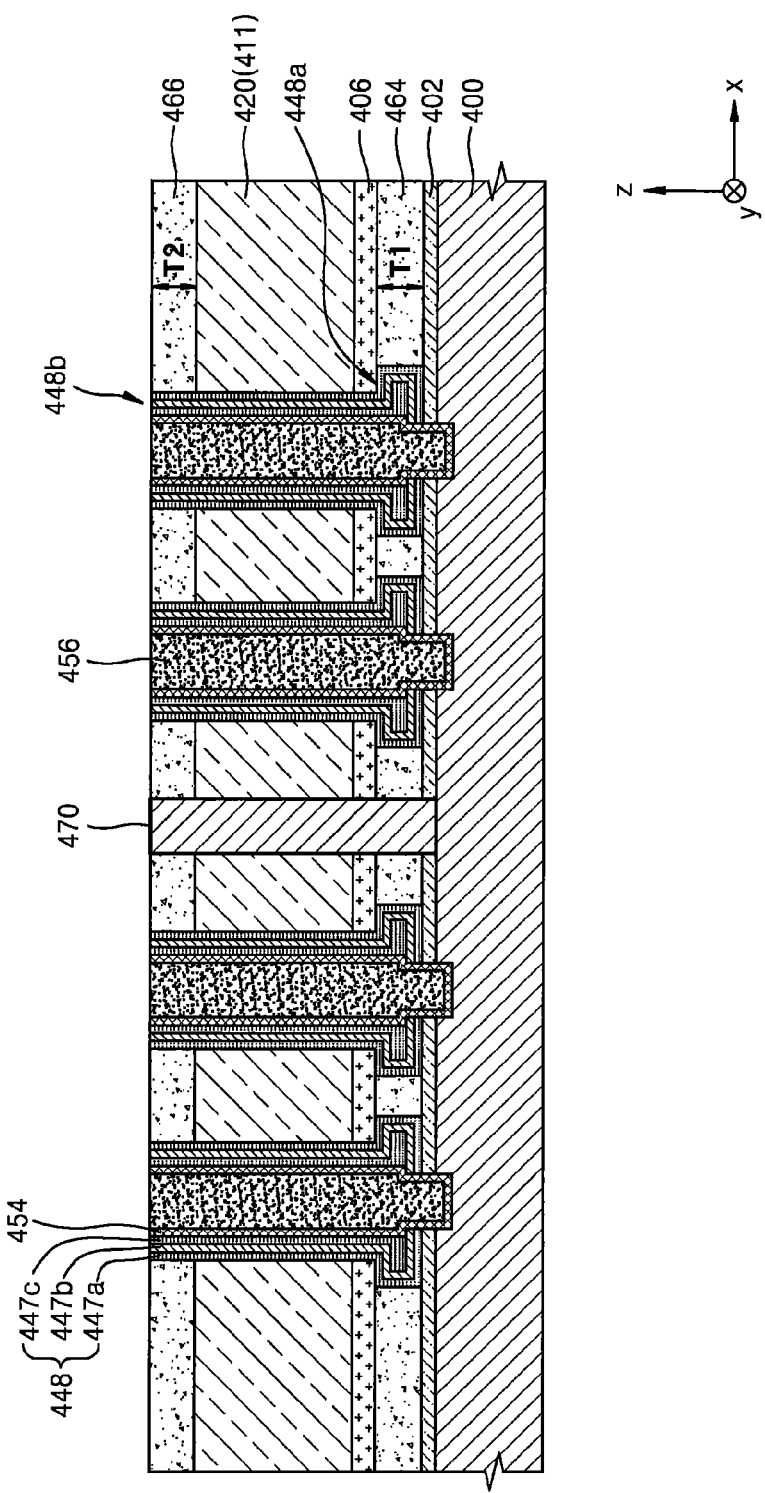

FIGS. 20 and 21 are cross-sectional views for describing a vertical-type memory device and a manufacturing method thereof, according to aspects of the present disclosure.

In detail, when compared with FIGS. 4 to 19, FIGS. 20 and 21 may be the same as FIGS. 4 to 19 except that the second etch control layer 406 is not oxidized. Thus, the second etch control layer 406 may include a polysilicon layer doped with carbon, P-type impurities, or N-type impurities.

First, the manufacturing processes of FIGS. 4 to 12 may be performed. Thus, as illustrated in FIG. 20, the first rib groove 460 that is connected to flanks of the second opening portion 458 may be formed under the second etch control layer 406 at a side of the channel layer 454 formed on the substrate 400. The first rib groove 460 is obtained by removing the recessed first etch control layer 404r with a polysilicon etchant.

Next, the sacrificial layer 430 exposed by the second opening portion 458 is removed by a wet etching process, and thus, the second rib groove 462 that is connected to flanks of the second opening portion 458 is formed on the interlayer insulation layer 420. When such a process is performed, the interlayer insulation layer 420 that extends in the first direction is formed on the gate insulation layer 448 on the channel layer 454.

As illustrated in FIG. 21, the first replacement gate electrode 464 and the second replacement gate electrode 466 are formed on sides of the blocking insulation layer 447a to respectively fill the first rib groove 460 and the second rib groove 462. Next, the isolating insulation layer 470 may be formed by forming an insulating material in the second opening portion 458.

Figure 22:
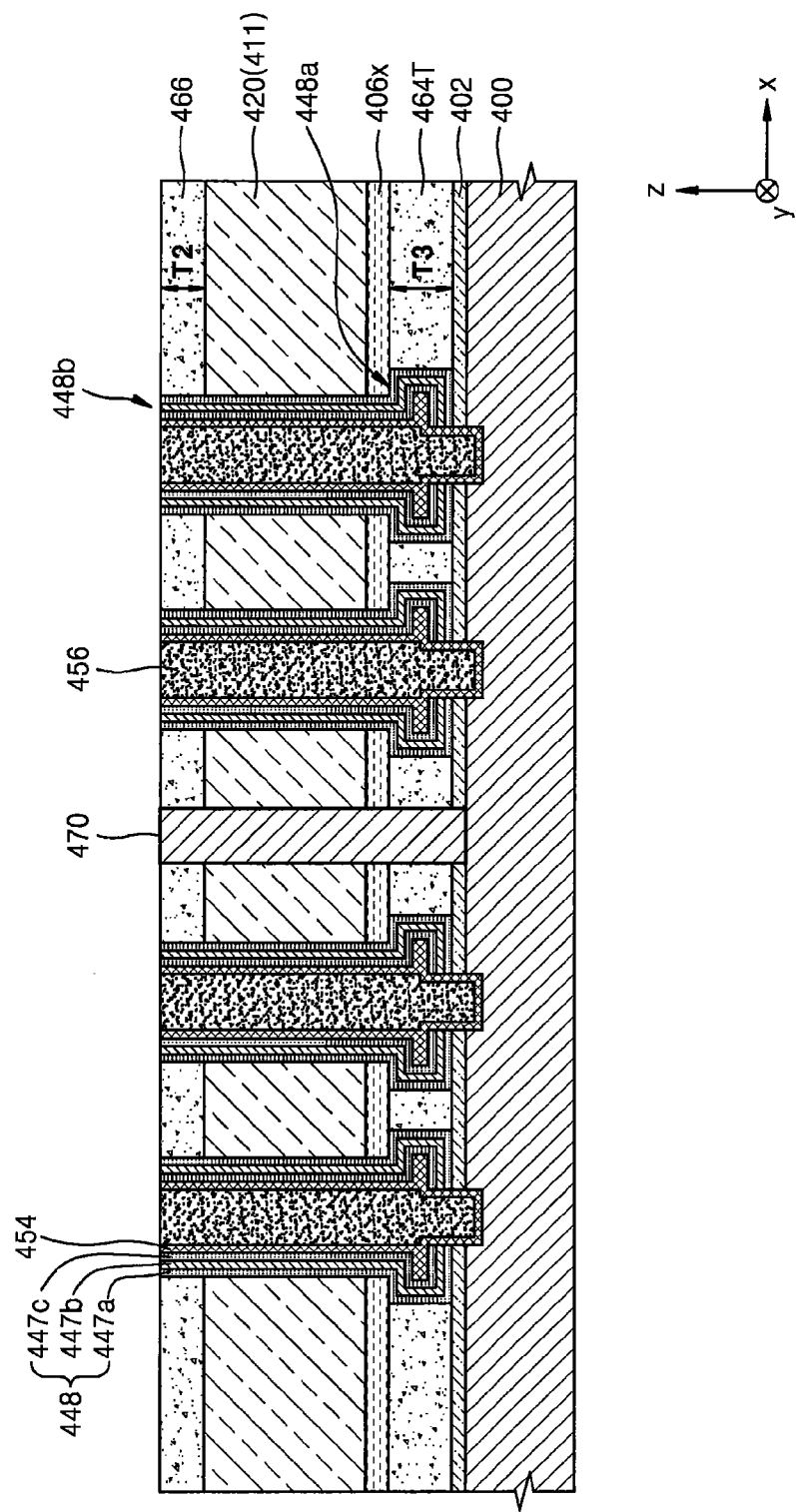
FIG. 22 is a cross-sectional view for describing a vertical-type memory device and a manufacturing method thereof, according to aspects of the present disclosure.

FIG. 22 is a cross-sectional view for describing a vertical-type memory device and a manufacturing method thereof, according to aspects of the present disclosure.

In detail, when compared with FIGS. 4 to 19, FIG. 22 may be the same as FIGS. 4 to 19 except that the thickness T3 of the first replacement gate electrode 464T is formed to be greater than the thickness T2 of the second replacement gate electrode 466.

First, as illustrated in FIG. 4, the pad insulation material layer 402a, the first etch control material layer 404a, and the second etch control material layer 406a are formed on the substrate 400. The material layers 411 to 415 and 431 to 434 respectively constituting the interlayer insulation material layer 420a and the sacrificial material layer 430a are alternately repeatedly stacked on the second etch control material layer 406a a plurality of times. In such a manufacturing process, the thickness T11 of the first etch control material layer 404a may be formed to be greater than the thickness T12 of the sacrificial material layer 430a.

Next, the manufacturing processes of FIGS. 5 to 15 are performed. Thus, as illustrated in FIG. 22, the thickness T3 of the first replacement gate electrode 464T may be formed to be greater than the thickness T2 of the second replacement gate electrode 466. In addition, the channel layer 454 may be formed to extend to a portion under the second etch control layer 406x.

Figure 23:
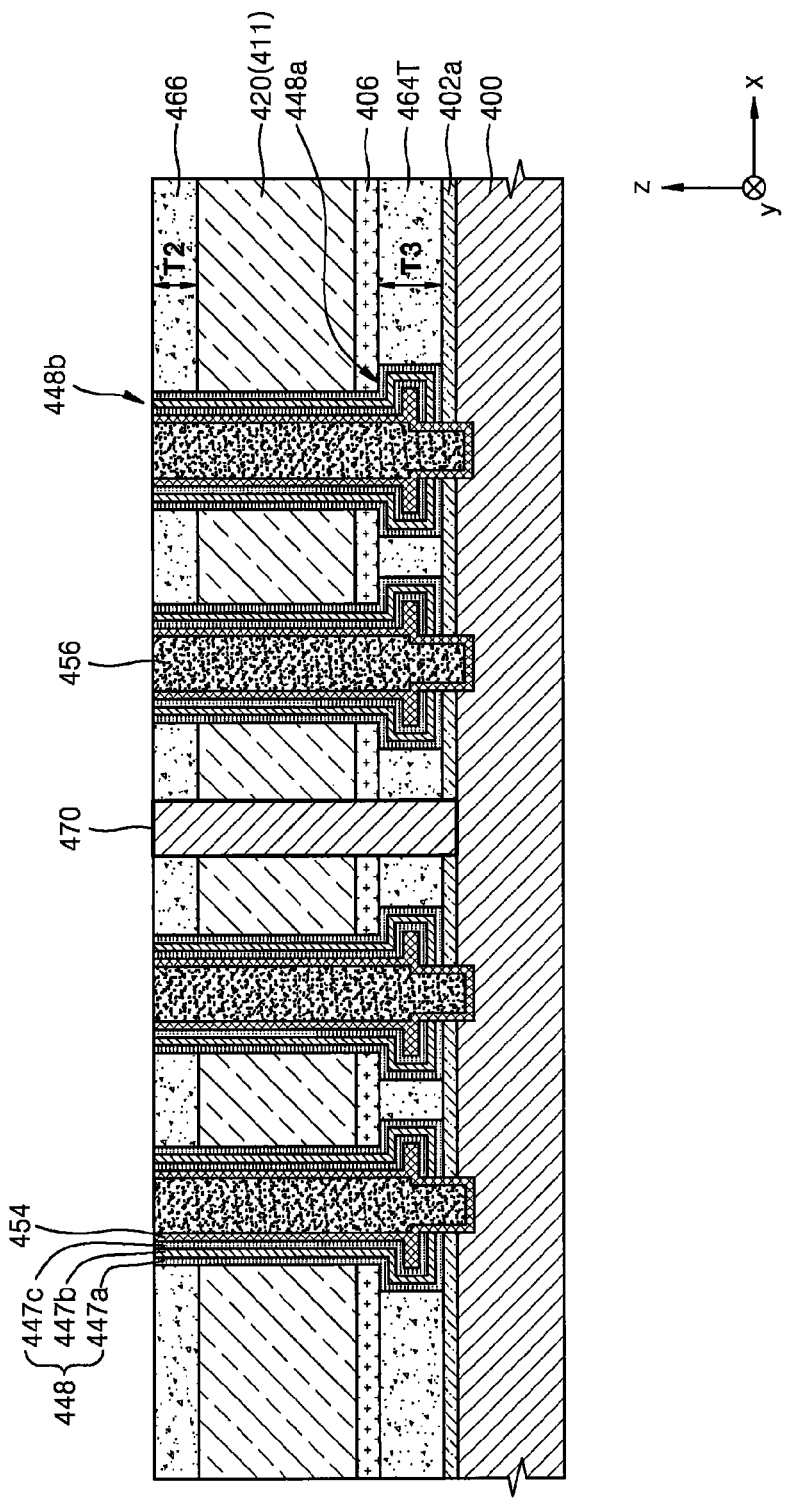
FIG. 23 is a cross-sectional view for describing a vertical-type memory device and a manufacturing method thereof, according to aspects of the present disclosure.

FIG. 23 is a cross-sectional view for describing a vertical-type memory device and a manufacturing method thereof, according to aspects of the present disclosure.

In detail, when compared with FIGS. 4 to 19, FIG. 23 may be the same as FIGS. 4 to 19 except that the thickness T3 of the first replacement gate electrode 464T is formed to be greater than the thickness T2 of the second replacement gate electrode 466, and the second etch control layer 464 is not oxidized. Also, when compared with FIG. 22, FIG. 23 may be the same as FIG. 22 except that the second etch control layer 406 is not oxidized.

First, as illustrated in FIG. 4, the pad insulation material layer 402a, the first etch control material layer 404a, and the second etch control material layer 406a are formed on the substrate 400. The material layers 411 to 415 and 431 to 434 respectively constituting the interlayer insulation material layer 420a and the sacrificial material layer 430a are alternately repeatedly stacked on the second etch control material layer 406a a plurality of times. In such a manufacturing process, the thickness T11 of the first etch control material layer 404a is formed to be greater than the thickness T12 of the sacrificial material layer 430a.

Next, the manufacturing processes of FIGS. 5 to 19 are performed. However, the process of oxidizing the second etch control material layer 406a illustrated in FIG. 13 is not performed. Thus, as illustrated in FIG. 23, the thickness T3 of the first replacement gate electrode 464T may be formed to be greater than the thickness T2 of the second replacement gate electrode 466. The channel layer 454 may be formed to extend to a portion under the second etch control layer 406. Also, since the second etch control layer 406 is not oxidized, the second etch control layer 406 may include a polysilicon layer doped with carbon, P-type impurities, or N-type impurities.

Figure 24:
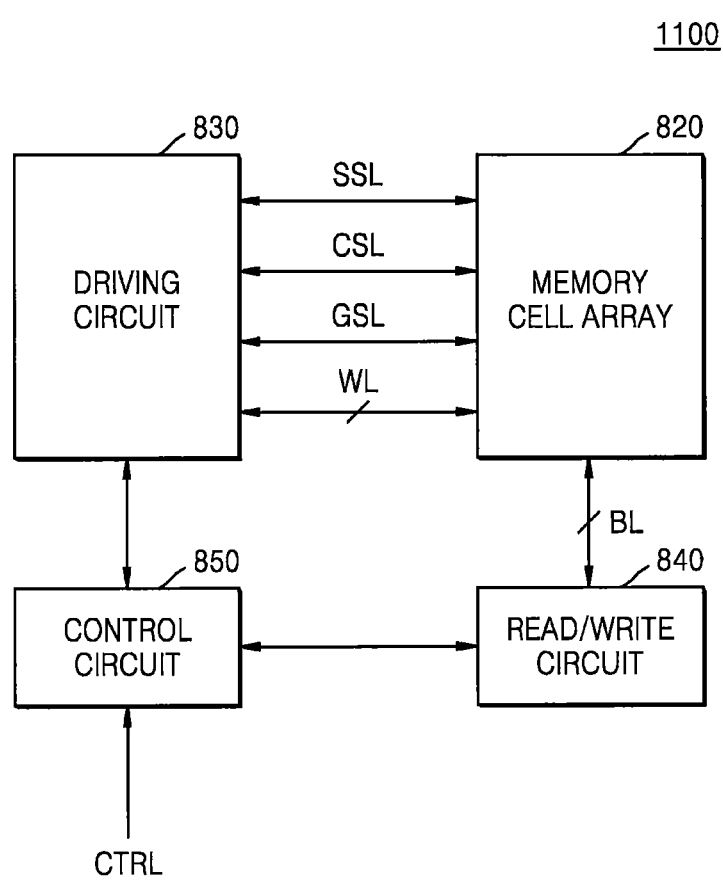
FIG. 24 is a schematic block diagram for describing a vertical-type memory device according to aspects of the present disclosure.

FIG. 24 is a schematic block diagram for describing the vertical-type memory device 1100 according to aspects of the present disclosure.

In detail, the vertical-type memory device 1100 according to an embodiment may include the memory cell array 820, a driving circuit 830, a read/write circuit 840, and a control circuit 850.

The above-described memory cell array 820 may include a plurality of memory cells, and the plurality of memory cells may be arranged in a plurality of rows and columns. The memory cells included in the memory cell array 820 may be connected to the driving circuit 830 via a word line WL, the common source line CSL, the string selection line SSL, the ground selection line GSL, etc. and may be connected to the read/write circuit 840 via a bit line BL.

In an embodiment, a plurality of memory cells arranged in the same row may be connected to the same word line WL, and a plurality of memory cells arranged in the same column may be connected to the same bit line BL.

In an embodiment, a plurality of memory cells included in the memory cell array 820 may be divided as a plurality of memory blocks. Each memory block may include a plurality of word lines WL, a plurality of string selection lines SSL, a plurality of ground selection lines GSL, a plurality of bit lines BL, and at least one common source line CSL. The driving circuit 830 and the read/write circuit 840 may be operated by the control circuit 850.

In an embodiment, the driving circuit 830 may receive address information from the outside and may select at least some of the word line WL, the common source line CSL, the string selection line SSL, and the ground selection line GSL that are connected to the memory cell array 820 by decoding the received address information. The driving circuit 830 may include a driving circuit for each of the word line WL, the string selection line SSL, and the common source line CSL.

According to a command received from the control circuit 850, the read/write circuit 840 may select at least some of bit lines BL connected to the memory cell array 820. The read/write circuit 840 may read data stored in a memory cell connected to the selected at least some bit lines BL or may write data to a memory cell connected to the selected at least some bit lines BL. The read/write circuit 840 may include circuits such as a page buffer, an input/output buffer, and a data latch in order to perform the above-described operation.

The control circuit 850 may control operations of the driving circuit 830 and the read/write circuit 840 in response to a control signal CTRL transmitted from the outside. When data stored in the memory cell array 820 is read, the control circuit 850 may control an operation of the driving circuit 830 to supply a voltage for performing a read operation to a word line WL where data to be read is stored. When the voltage for performing a read operation is supplied to the particular word line WL, the control circuit 850 may control the read/write circuit 840 to read data stored in a memory cell connected to the word line WL supplied with the voltage for performing a read operation.

When data is written to the memory cell array 820, the control circuit 850 may control an operation of the driving circuit 830 to supply a voltage for performing a write operation to a word line WL where data is to be written. When the voltage for performing a write operation is supplied to the particular word line WL, the control circuit 850 may control the read/write circuit 840 to record data onto a memory cell connected to the word line WL supplied with the voltage for performing a write operation.

A vertical-type memory device according to the present disclosure has an opening portion that is used as a channel hole, formed by sequentially etching two etch control material layers formed on a substrate and having etch selectivity, an interlayer insulation material layer, and a sacrificial material layer. The vertical-type memory device according to the present disclosure may have an opening portion that exposes the substrate formed reliably due to the etch control material layers and thus may not have a silicon epi-layer formed in the opening portion at a lower portion of the substrate by a selective epitaxial growth method.

Also, a vertical-type memory device according to the present disclosure may have a thickness (channel length) of a first replacement gate electrode that is used in a ground transistor adjusted by adjusting a thickness of an etch control material layer that is formed on a substrate and thus may have thicknesses of the first replacement gate electrode and a second replacement gate electrode that is used in a memory cell differed from each other.

In addition, when thickness of a first replacement gate electrode and a second replacement gate electrode that is used in a memory cell are the same as each other, a vertical-type memory device according to the present disclosure may have the first replacement gate electrode and the second replacement gate electrode formed simultaneously and thus may have manufacturing processes simplified and device manufacturing costs decreased.

While aspects of the present disclosure have been particularly shown and described with reference to embodiments thereof, they are provided for purposes of illustration, and it will be understood by one of ordinary skill in the art that various changes in form and details may be made therein. The aforementioned embodiments may be implemented as only one or may be implemented by combining one or more.

Thus, the technical scope of the present disclosure is not construed as limited to one or more embodiments illustrated herein. The embodiments described above should be considered in a descriptive sense in every aspect and not for purposes of limitation. The true technical scope of the present disclosure is to be defined with reference to the appended claims.

What is claimed is:

1. A vertical-type memory device comprising:
a channel layer vertically extending on a substrate;
a ground selection transistor at a side of the channel layer on the substrate, the ground selection transistor comprising a first gate insulation portion and a first replacement gate electrode;
an etch control layer on the first replacement gate electrode; and
a memory cell on the etch control layer, the memory cell comprising a second gate insulation portion and a second replacement gate electrode.

2. The vertical-type memory device of claim 1, wherein the etch control layer comprises a polysilicon layer doped with carbon, N-type impurities, or P-type impurities.

3. The vertical-type memory device of claim 1, wherein the etch control layer comprises a polysilicon oxide layer comprising carbon, N-type impurities, or P-type impurities.

4. The vertical-type memory device of claim 1, wherein a thickness of the first replacement gate electrode is the same as a thickness of the second replacement gate electrode.

5. The vertical-type memory device of claim 1, wherein a recess side groove in the first replacement gate electrode is under the etch control layer, and the first gate insulation portion is in the recess side groove.

6. The vertical-type memory device of claim 1, wherein a thickness of the first replacement gate electrode is greater than a thickness of the second replacement gate electrode.

7. The vertical-type memory device of claim 6, wherein a recess side groove in the first replacement gate electrode is under the etch control layer, and the channel layer and the first gate insulation portion are in the recess side groove.

8. The vertical-type memory device of claim 1, wherein the first replacement gate electrode is adjacent to a sidewall of a laterally extending portion of the first gate insulation portion.

9. The vertical-type memory device of claim 1, wherein the channel layer has an internal opening portion filled with a filling insulation layer.

10. The vertical-type memory device of claim 1, wherein the substrate comprises a recess, and wherein the channel layer vertically extends into the recess and contacts the substrate.

11. A vertical-type memory device comprising:
a channel layer vertically extending on a substrate;
a gate insulation layer at a side of the channel layer, the gate insulation layer vertically extending on the substrate;
an etch control layer at a side of the gate insulation layer, the etch control layer extending horizontally with respect to the substrate and separated vertically with respect to the substrate by a first opening;
a first replacement gate electrode in the first opening under the etch control layer;
a plurality of interlayer insulation layers stacked on the etch control layer vertically with respect to the substrate, and separate from each other due to a plurality of second openings; and
a second replacement gate electrode in each of the plurality of second openings.

12. The vertical-type memory device of claim 11, wherein the etch control layer comprises a polysilicon layer doped with impurities or a polysilicon oxide layer.

13. The vertical-type memory device of claim 11, wherein a thickness of the first replacement gate electrode is the same as a thickness of the second replacement gate electrode.

14. The vertical-type memory device of claim 11, wherein a recess side groove that faces the channel layer is under the etch control layer, and the gate insulation layer is in the recess side groove.

15. The vertical-type memory device of claim 11, wherein a thickness of the first replacement gate electrode is greater than a thickness of the second replacement gate electrode, a recess side groove that faces the channel layer is under the etch control layer, and the channel layer and the gate insulation layer are in the recess side groove.

16. A vertical-type memory device, comprising:
a channel layer vertically extending on a substrate;
a pad insulation material layer on the substrate;
an etch control layer above the pad insulation material layer;
a gate insulation layer at a side of the channel layer, the gate insulation layer vertically extending on a wall of the etch control layer and horizontally extending into a recess between the etch control layer and the pad insulation material layer; and
a first replacement gate electrode on a wall of the gate insulation layer between the etch control layer and the pad insulation material layer.

17. The vertical-type memory device of claim 16, further comprising:
a plurality of interlayer insulation layers stacked on the etch control layer vertically with respect to the substrate, and separated from each other by one of a plurality of second replacement gate electrodes.

18. The vertical-type memory device of claim 17, wherein a thickness of the first replacement gate electrode is smaller than a common thickness of the plurality of second replacement gate electrodes.

19. The vertical-type memory device of claim 16, wherein the etch control layer comprises a polysilicon layer doped with impurities or a polysilicon oxide layer.

20. The vertical-type memory device of claim 16, wherein the vertical-type memory device is free from a silicon epi-layer from under the channel layer.

* * * * *